(12) United States Patent
Iwai et al.

(10) Patent No.: US 12,301,221 B2
(45) Date of Patent: May 13, 2025

(54) OVERCURRENT PROTECTION CIRCUIT FOR PROTECTING SEMICONDUCTOR DEVICE FROM OVERCURRENT AT HIGH SPEED, AND SWITCHING CIRCUIT PROVIDED WITH THE OVERCURRENT PROTECTION CIRCUIT

(71) Applicant: OMRON Corporation, Kyoto (JP)

(72) Inventors: Satoshi Iwai, Kyoto (JP); Mamoru Sueki, Kyoto (JP)

(73) Assignee: OMRON CORPORATION, Kyoto (JP)

( * ) Notice: Subject to any disclaimer, the term of this patent is extended or adjusted under 35 U.S.C. 154(b) by 162 days.

(21) Appl. No.: 18/021,441

(22) PCT Filed: Aug. 17, 2021

(86) PCT No.: PCT/JP2021/030013
§ 371 (c)(1),
(2) Date: Feb. 15, 2023

(87) PCT Pub. No.: WO2022/050040
PCT Pub. Date: Mar. 10, 2022

(65) Prior Publication Data
US 2023/0308088 A1    Sep. 28, 2023

(30) Foreign Application Priority Data

Sep. 1, 2020    (JP) .................... 2020-147017

(51) Int. Cl.
*H03K 17/082* (2006.01)
*H02M 1/08* (2006.01)

(52) U.S. Cl.
CPC ............ *H03K 17/082* (2013.01); *H02M 1/08* (2013.01)

(58) Field of Classification Search
CPC .... H02H 7/12; H02M 1/0006; H02M 1/0009; H02M 1/08; H02M 1/32; H02M 3/155;
(Continued)

(56) References Cited

U.S. PATENT DOCUMENTS

| 5,675,469 A | 10/1997 | Racino et al. |
| 11,545,972 B2 * | 1/2023 | Nakada .................. H02M 1/32 |

(Continued)

FOREIGN PATENT DOCUMENTS

| JP | H11312789 A | 11/1999 |
| JP | 2004533713 A | 11/2004 |

(Continued)

OTHER PUBLICATIONS

International Search Report for International Application No. PCT/JP2021/030013; Mailing Date, Oct. 12, 2021.
(Continued)

*Primary Examiner* — Jared Fureman
*Assistant Examiner* — Nicolas Bellido
(74) *Attorney, Agent, or Firm* — CANTOR COLBURN LLP

(57) ABSTRACT

The overcurrent protection circuit includes: a first transistor having an emitter connected to a control voltage; and a second transistor having a base connected to a collector of the first transistor, a collector connected to a base of the first transistor and pulled up to a voltage, and a grounded emitter. When the control voltage exceeds a first threshold voltage, the first and second transistors are turned on, the control voltage decreases as a result of decrease in the pull-up voltage, and a protection operation to turn a switching element off is started, and the overcurrent protection circuit includes a first diode connected between the control voltage and the emitter of the first transistor, and an element circuit connected between the emitter and the base thereof. The
(Continued)

element circuit includes any of a second diode, a first resistor, and a parallel circuit including the second diode and the first resistor.

7 Claims, 21 Drawing Sheets

(58) Field of Classification Search
CPC .... H02M 3/156; H02M 3/158; H02M 7/5387; H03K 17/08104; H03K 17/0812; H03K 17/08122; H03K 17/082; H03K 17/0826; H03K 17/567; H03K 17/687; Y02B 70/10
See application file for complete search history.

(56) References Cited

U.S. PATENT DOCUMENTS

| | | | |
|---|---|---|---|
| 2002/0053704 A1 | 5/2002 | Avery et al. | |
| 2002/0122280 A1 | 9/2002 | Ker et al. | |
| 2007/0058307 A1 | 3/2007 | Mergens et al. | |
| 2011/0075307 A1* | 3/2011 | Murota | H02H 3/093 361/57 |
| 2013/0279053 A1 | 10/2013 | Ritter et al. | |
| 2015/0263514 A1* | 9/2015 | Koishi | H03K 17/0828 361/93.7 |
| 2016/0036219 A1 | 2/2016 | Campi, Jr. et al. | |
| 2021/0226620 A1 | 7/2021 | Nakada et al. | |
| 2021/0242864 A1* | 8/2021 | Okada | H02M 3/156 |
| 2022/0278522 A1* | 9/2022 | Iwai | H02M 1/08 |

FOREIGN PATENT DOCUMENTS

| | | | | |
|---|---|---|---|---|
| JP | 2006014402 A | 1/2006 | | |
| JP | 2020127267 A | 8/2020 | | |
| WO | WO-2016114416 A1 * | 7/2016 | | H03K 17/08 |

OTHER PUBLICATIONS

PCT Written Opinion of the International Searching Authority for International Application No. PCT/JP2021/030013; Mailing Date, Oct. 12, 2021.
EPO Extended European Search Report for corresponding EP Application No. 21864098.5; Issued Aug. 22, 2024.
JPO Notice of Reasons for Refusal for corresponding JP Application No. 2020147017; Issued Jul. 2, 2024.

* cited by examiner

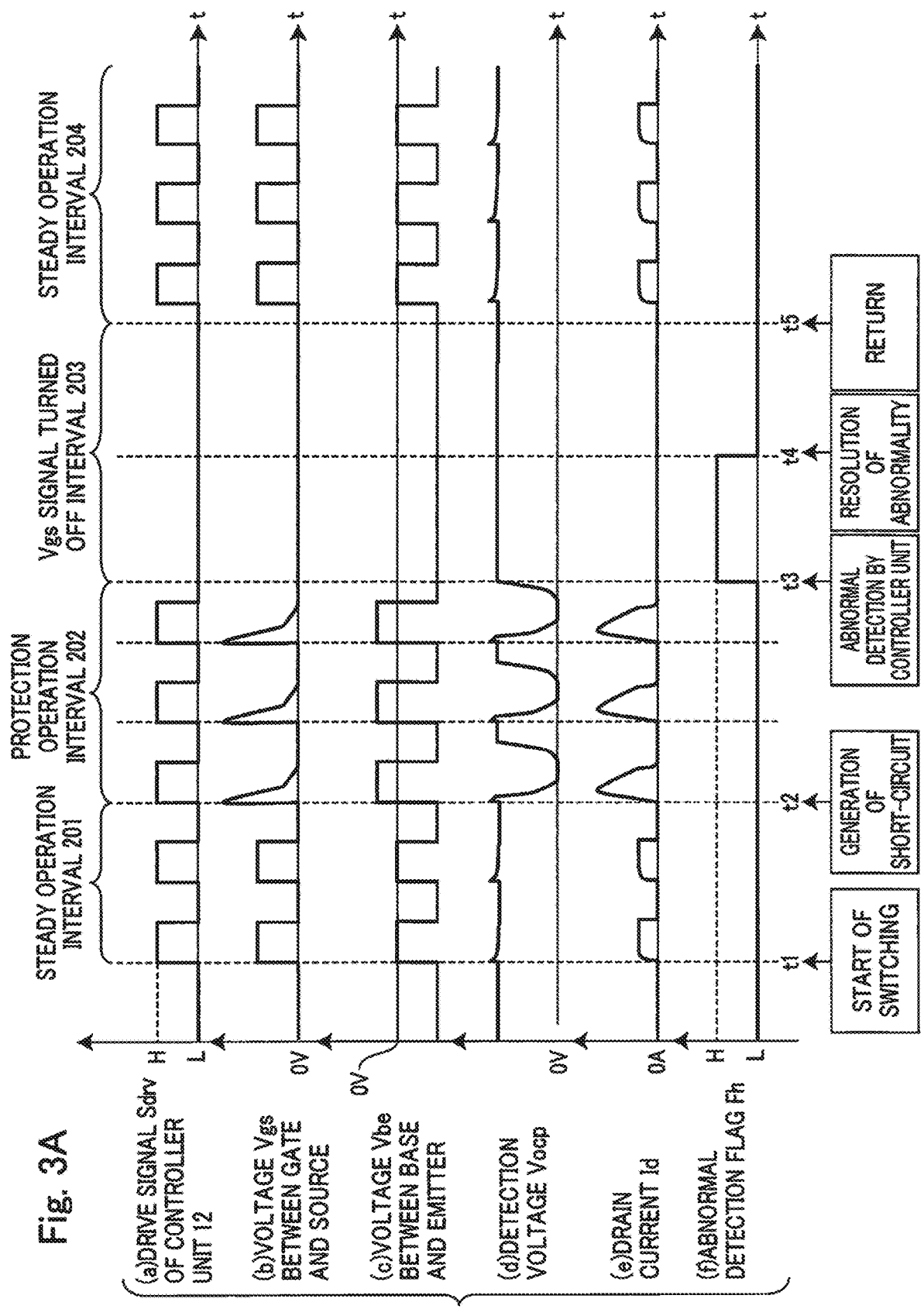

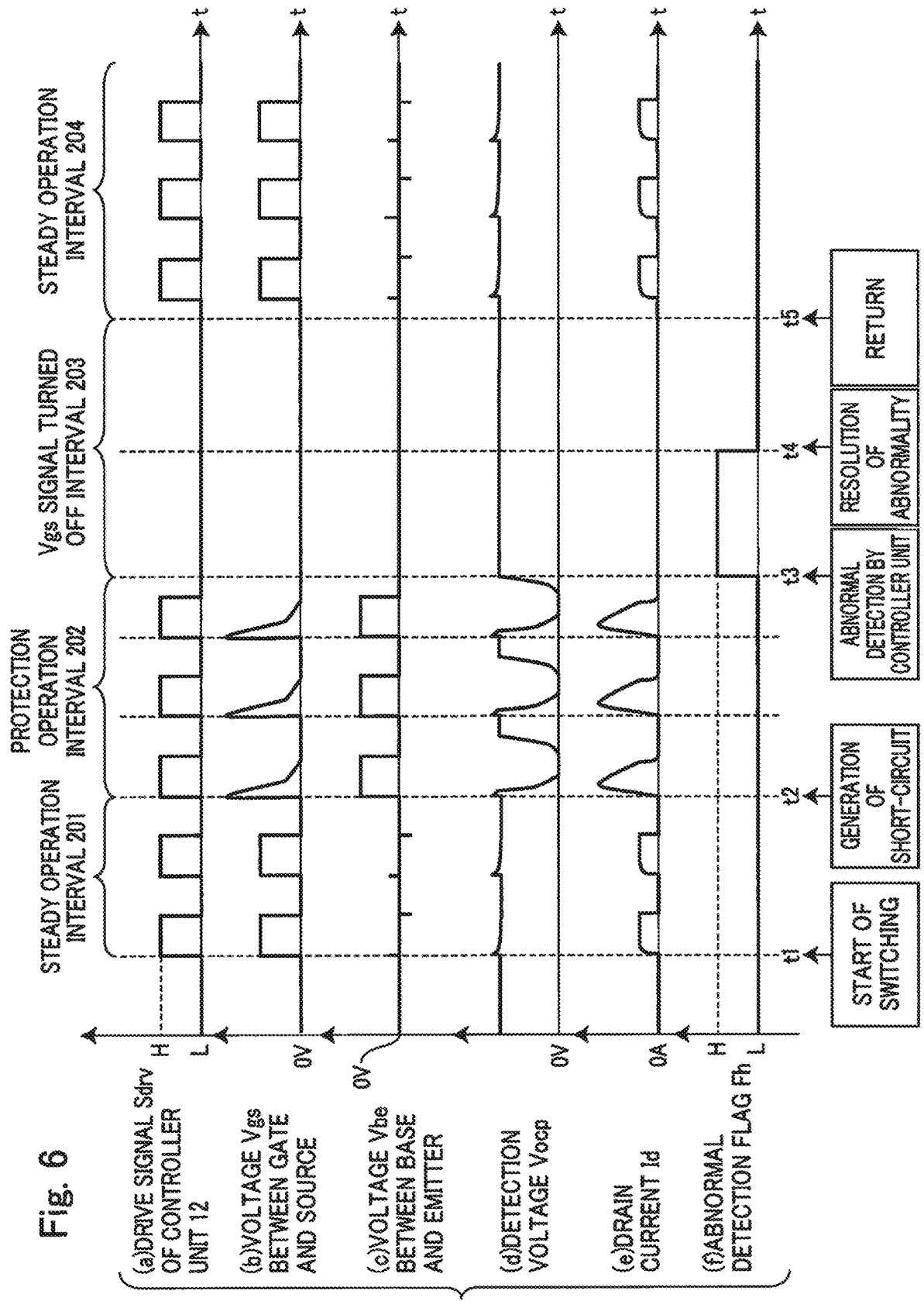

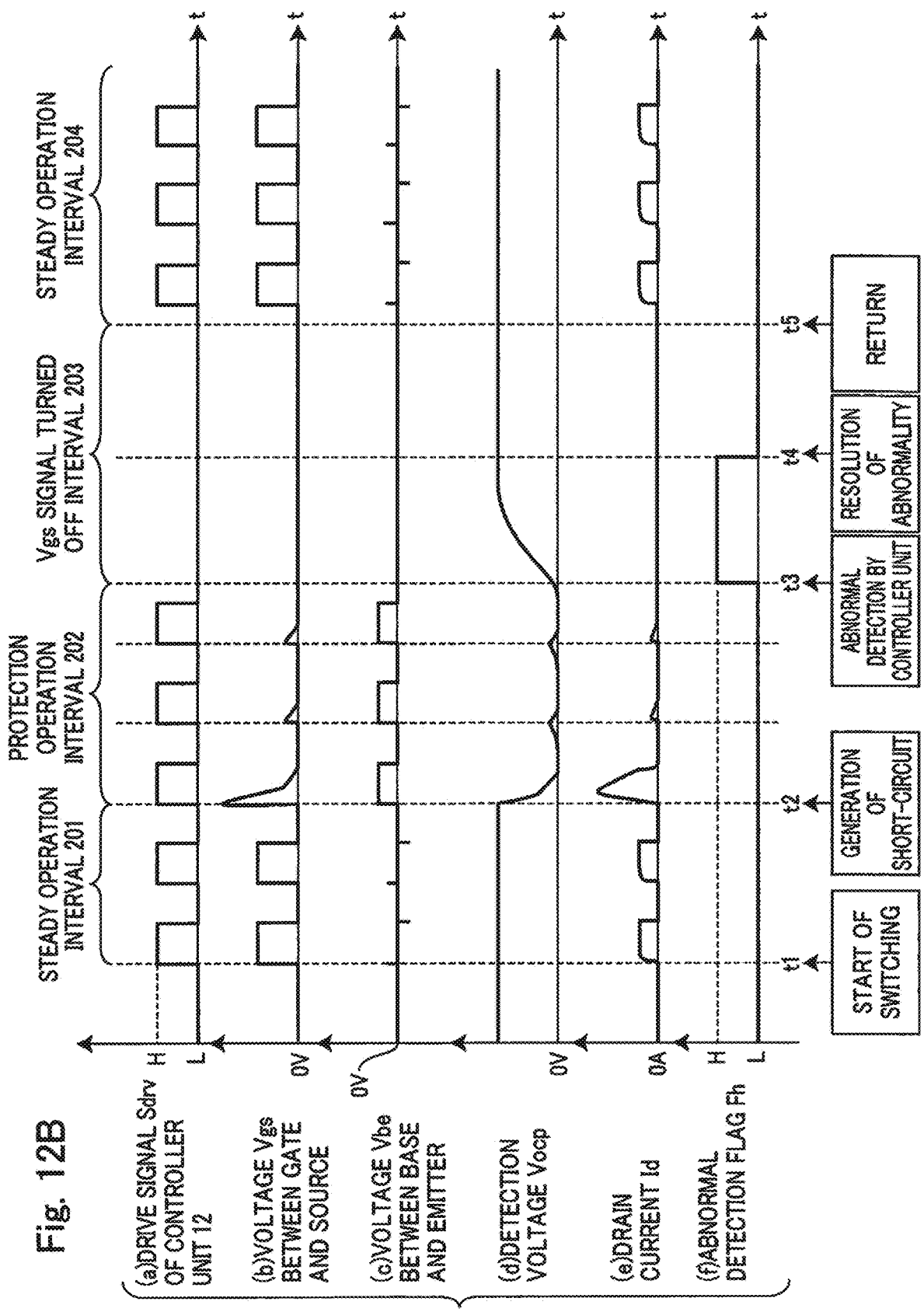

OVERCURRENT PROTECTION CIRCUIT FOR PROTECTING SEMICONDUCTOR DEVICE FROM OVERCURRENT AT HIGH SPEED, AND SWITCHING CIRCUIT PROVIDED WITH THE OVERCURRENT PROTECTION CIRCUIT

CROSS REFERENCE TO RELATED APPLICATIONS

This is the U.S. national stage of application No. PCT/JP2021/030013, filed on Aug. 17, 2021. Priority under 35 U.S.C. § 119(a) and 35 U.S.C. § 365(b) is claimed from Japanese Application No. 2020-147017, filed Sep. 1, 2020, the disclosure of which is also incorporated herein by reference.

TECHNICAL FIELD

The present invention relates to an overcurrent protection circuit and a switching circuit including the overcurrent protection circuit. In this case, the switching circuit is, for example, a switching circuit such as a boost chopper circuit, a half-bridge inverter circuit, or a full-bridge inverter circuit.

BACKGROUND ART

A semiconductor device generally has a short circuit tolerance, and when a current exceeding the short circuit tolerance flows, the semiconductor device may be broken. The overcurrent protection of the semiconductor device can be performed by detecting an overcurrent flowing through the semiconductor device due to a short circuit at a high speed and stopping the current flowing through the semiconductor device.

For example, Patent Document 1 provides an overcurrent protection device of a power conversion device that can change a set level of a detection voltage of collector short-circuit detection at arbitrary timing even in a case where a DC voltage is high, low, or constant, and can reliably protect a voltage drive element from overcurrent.

The overcurrent protection device according to Patent Document 1 includes a power conversion device having a voltage-driven power switching element, an overcurrent detection unit that detects a voltage of an input-side main terminal of the power switching element and gives an off signal to the power switching element when the voltage exceeds a predetermined value, and an overcurrent setting unit that can be connected to the overcurrent detection unit in a parallel relationship at any timing and can change the predetermined value.

A GaN device is a semiconductor device using gallium nitride GaN, and has a feature that it can be driven at a high frequency as compared with a conventional semiconductor device such as an insulated gate bipolar transistor (IGBT) and a SiC device.

PRIOR ART DOCUMENT

Patent Document

[Patent Document 1] Japanese Patent Laid-open Publication No. JP2006-14402A

SUMMARY OF THE INVENTION

Problems to be Solved by the Invention

However, a GaN device is weaker in overcurrent than a conventional semiconductor device, and may be broken by an overcurrent of, for example, about 100 nanoseconds. Therefore, conventional overcurrent protection technologies such as a desaturation protection (DESAT) function, a current transformer (CT) detection, and the technology of Patent Document 1, which are protection functions for detecting an unsaturated (overcurrent) state between a collector and an emitter of an IGBT element and automatically cutting off a gate, cannot sufficiently protect the GaN device.

An object of the present invention is to solve the above problems and to provide an overcurrent protection circuit capable of protecting a semiconductor switch from overcurrent at a higher speed than in the prior art, and a switching circuit including the overcurrent protection circuit.

Means for Solving the Problems

According to one aspect of present invention, there is provided an overcurrent protection circuit for a switching element that is controlled to be turned on/off based on a control voltage. The overcurrent protection circuit includes first and second transistors. The first transistor is a PNP bipolar transistor and has an emitter connected to the control voltage, and the second transistor that is an NPN bipolar transistor, has a base connected to a collector of the first transistor, a collector connected to a base of the first transistor and pulled up to a predetermined pull-up voltage, and a grounded emitter. The overcurrent protection circuit is configured to start a protection operation in which when the control voltage exceeds a redetermined first threshold voltage, the first and second transistors are turned on, the control voltage is decreased by decrease of the pull-up voltage, and the switching element is turned off. The overcurrent protection circuit includes a first diode having an anode connected to the control voltage and a cathode connected to the emitter of the first transistor; and an element circuit connected between the emitter of the first transistor and the base of the first transistor. The element circuit is any one of: (1) a second diode having a cathode connected to the emitter of the first transistor and an anode connected to the base of the first transistor; (2) a first resistor; and (3) a parallel circuit of the second diode and the first resistor.

Effect of the Invention

Therefore, according to the overcurrent protection circuit and the like according to the present invention, the semiconductor device can be protected from overcurrent at a higher speed than in the prior art.

BRIEF DESCRIPTION OF THE DRAWINGS

FIG. 3A is a timing chart showing operation waveforms of signals and the like in the current-driven switching circuit 110 of FIG. 2.

FIG. 6 is a timing chart showing operation waveforms of signals and the like in the current-driven switching circuit 10 of FIG. 5.

FIG. 12B is a timing chart showing operation waveforms of signals and the like in the current-driven switching circuit 10C of FIG. 12A.

MODE FOR CARRYING OUT THE INVENTION

Hereinafter, embodiments according to the present invention will be described with reference to the drawings. However, each embodiment described below is merely an example of the present invention in all respects. It goes without saying that various improvements and modifications can be made without departing from the scope of the present invention. That is, in carrying out the present invention, a specific configuration according to the embodiment may be appropriately adopted.

Hereinafter, a circuit configuration and an operation of a comparison example, and problems related thereto will be described, and then embodiments and modified embodiments for solving the problems will be described.

Comparison Example

Figure 1:
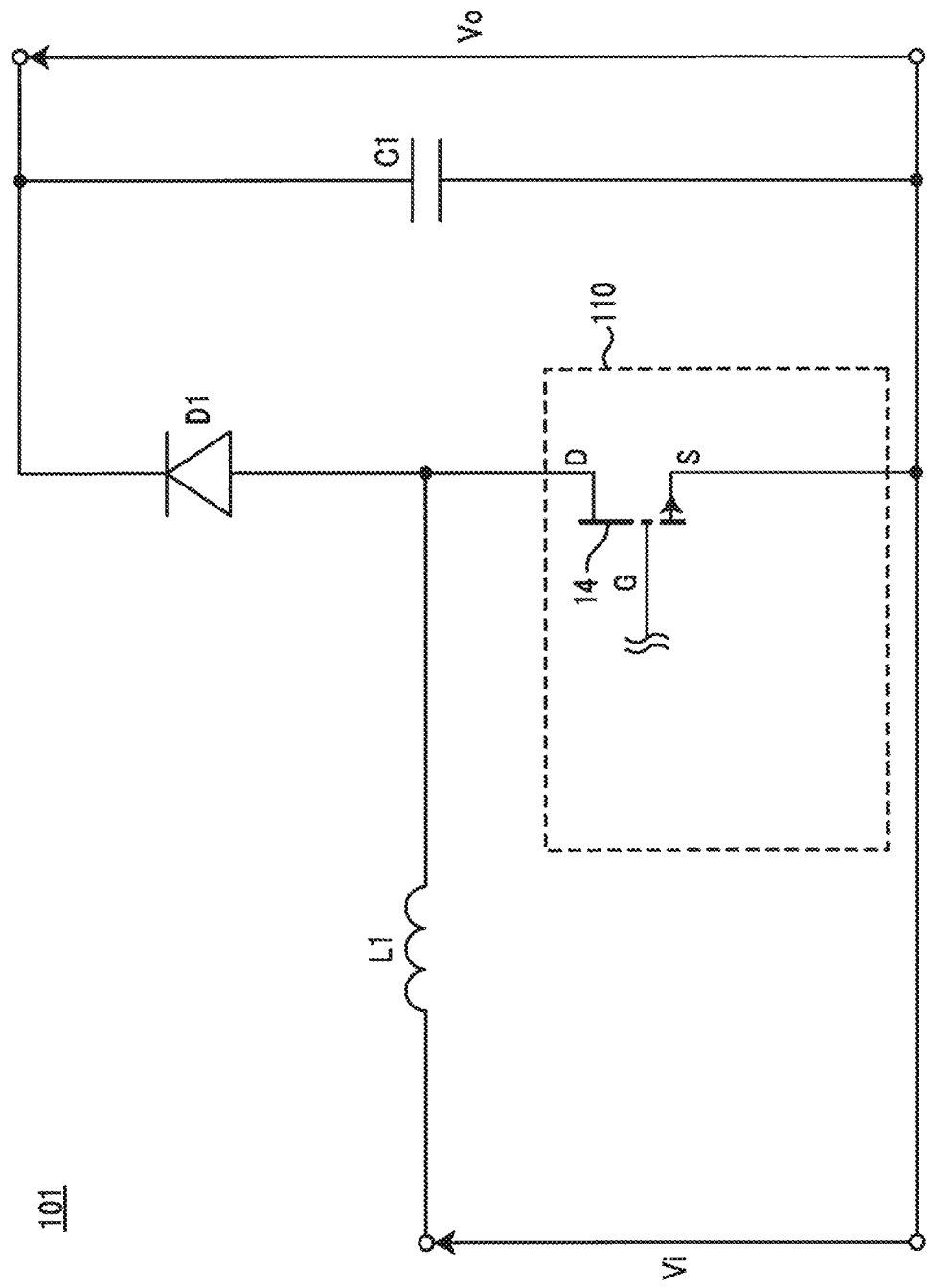
FIG. 1 is a block diagram illustrating a configuration example of a boost chopper circuit 101 according to a comparison example.

FIG. 1 is a block diagram illustrating a configuration example of a boost chopper circuit 101 according to a comparison example. Referring to FIG. 1, the boost chopper circuit 101 includes a current-driven switching circuit 110 having a semiconductor switch 14 that is a switching element, an inductor L1, a diode D1, and a capacitor C1.

Referring to FIG. 1, an input voltage Vi is applied to the connection point of an anode of the diode D1 and a drain of the semiconductor switch 14 via the inductor L1. A source of the semiconductor switch 14 is grounded. The cathode of the diode D1 is connected to one end of the capacitor C1 that outputs an output voltage Vo, and the other end thereof is grounded.

In the boost chopper circuit 101 configured as described above, the inductor L1 generates electromotive force in a direction in which a change in current is prevented. Therefore, when the semiconductor switch 14 is switched from turning on to turning off based on a control voltage applied to a gate that is a control terminal thereof, the inductor L1 generates an electromotive force in the same direction as the input voltage Vi so as to prevent the current from being decreased by the resistance of the diode D1. As a result, a voltage higher than the input voltage Vi is generated, and the voltage is smoothed by the capacitor C1 and converted into the output voltage Vo. Therefore, by periodically and selectively switching on and off of the semiconductor switch 14, the boost chopper circuit 101 converts the input voltage Vi into the DC output voltage Vo higher than the input voltage Vi and outputs the DC output voltage Vo.

Figure 2:
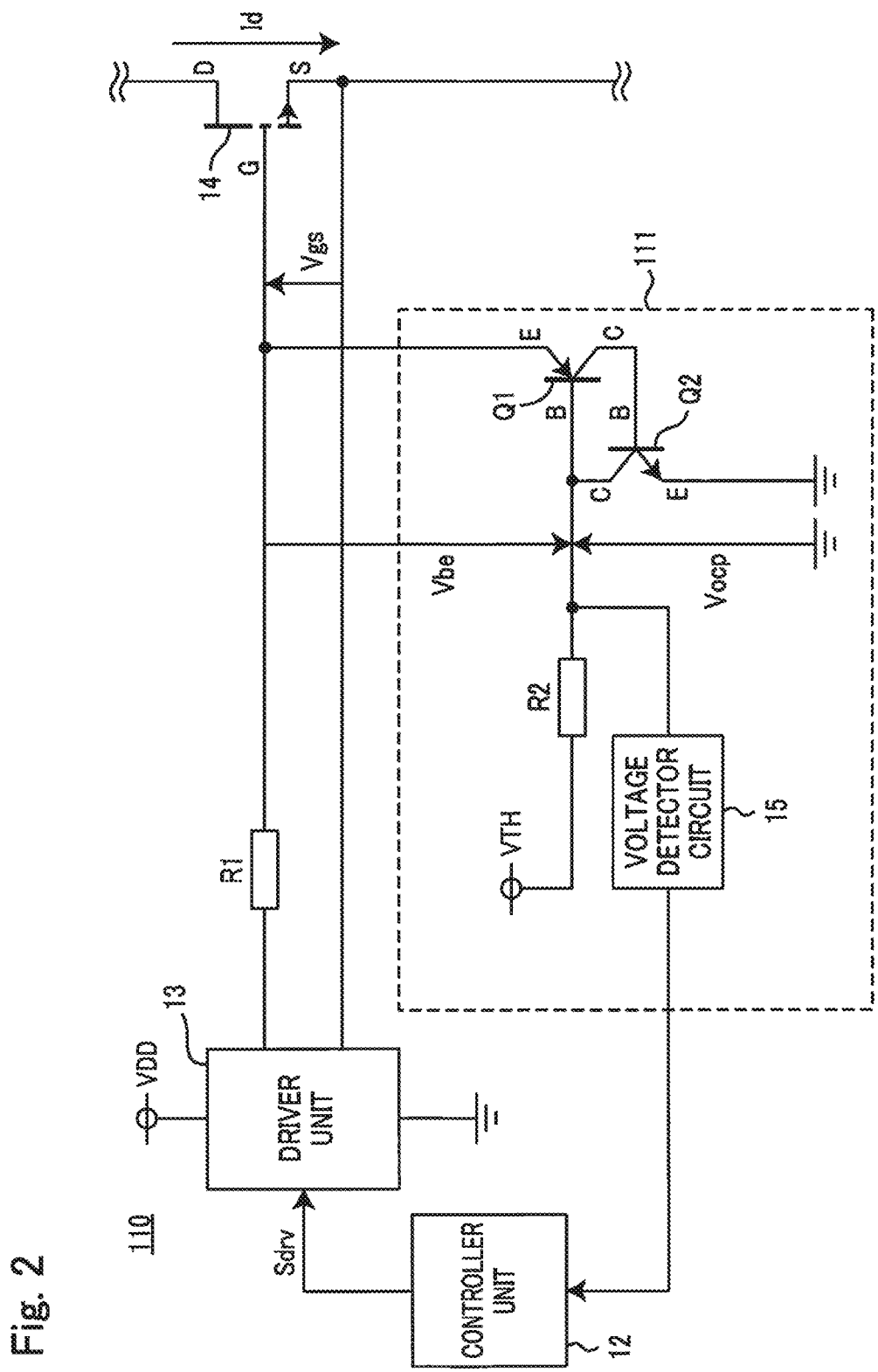
FIG. 2 is a block diagram illustrating a detailed configuration example of a current-driven switching circuit 110 of FIG. 1.

FIG. 2 is a block diagram illustrating a detailed configuration example of the current-driven switching circuit 110 of FIG. 1. In FIG. 2, the current-driven switching circuit 110 includes an overcurrent protection circuit 111, a controller unit 12, a driver unit 13, a semiconductor switch 14, and a resistor R1. The overcurrent protection circuit 111 includes transistors Q1 and Q2, a pull-up resistor R2, and a voltage detector circuit 15.

Referring to FIG. 2, the controller unit 12 controls the driver unit 13 by a drive signal Sdrv that is a pulse signal. In addition, the controller unit 12 monitors a signal indicating a detection voltage Vocp applied from the voltage detector circuit 15 of the overcurrent protection circuit 111 to a base of the transistor Q1, and when the detection voltage Vocp is less than a predetermined threshold, sets an abnormality detection flag Fh to a high level and fixes the drive signal Sdrv to a low level to stop the driver unit 13.

The driver unit 13 applies the voltage Vgs between the gate and the source to the gate of the semiconductor switch 14 via the resistor R1 on the basis of the drive signal Sdrv from the controller unit 12, and controls turning on/off of the semiconductor switch 14. The semiconductor switch 14 is, for example, a switching element such as a GaN device, and turning on/off thereof is controlled by the driver unit 13 to selectively switch whether or not to conduct a drain current Id. The voltage Vgs between the gate and the source is an example of a "control voltage" of the present invention.

In the overcurrent protection circuit 111, the transistor Q1 is, for example, a PNP bipolar transistor. In addition, the transistor Q2 is, for example, an NPN bipolar transistor, and includes a base connected to the collector of the transistor Q1, a collector connected to the base of the transistor Q1, and a grounded emitter. In addition, the collector of the transistor Q2 is pulled up to a threshold voltage VTH via the pull-up resistor R2. The threshold voltage VTH is an example of a "pull-up voltage" of the present invention.

In this case, no current flows through the base of the transistor Q2 while the transistor Q1 is turned off (insulated). When the transistor Q1 is turned on, conduction between the emitter and the collector is established, so that a current flows between the base and the emitter of the transistor Q2. Therefore, when the transistor Q1 is turned on, the transistor Q2 is also turned on. The voltage detector circuit 15 detects the detection voltage Vocp, which is a voltage between the collector and the emitter of the transistor Q2, and outputs a signal indicating the detection voltage Vocp to the controller unit 12. It is noted that the voltage detector circuit 15 is an example of a "voltage detection unit" of the present invention, and a signal indicating the detection voltage Vocp is an example of a "first control signal" of the present invention.

Figure 3B:
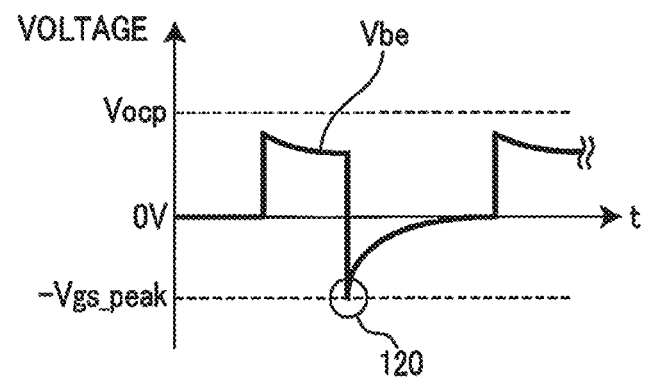
FIG. 3B is an enlarged diagram of a voltage Vbe between a base and an emitter of a transistor Q1 of FIG. 3A.

FIG. 3A is a timing chart showing an operation waveform of a signal or the like in the current-driven switching circuit 110 of FIG. 2, and FIG. 3B is an enlarged diagram of the voltage Vbe between the base and the emitter of the transistor Q1 of FIG. 3A.

Referring to FIG. 3A, the current-driven switching circuit 110 starts operating at time t1, a short circuit occurs in the semiconductor switch 14 at time t2 and a protection operation starts, and the controller unit 12 detects the short circuit at time t3. Further, the abnormal state is resolved at time t4, and the operation returns to the steady operation at time t5. In this case, the interval from time t1 to time t2 is referred to as a steady operation interval 201, the interval from time t2 to time t3 is referred to as a protection operation interval 202, and the interval from time t3 to time t5 is referred to as the Vgs signal turned off interval (or stop interval) 204.

In the steady operation interval 201, since no current flows through the pull-up resistor R2 except for the interval in which the detection voltage Vocp overshoots, the detection voltage Vocp is the threshold voltage VTH. Since the threshold voltage VTH is set higher than the voltage Vgs between the gate and the source supplied by the driver unit 13 when the drive signal Sdrv is at the high level, both the transistors Q1 and Q2 are always turned off in the steady operation interval 201.

In general, when an overcurrent flows through a semiconductor device, a voltage Vgs between a gate and a source of a semiconductor switch included in the semiconductor device overshoots (instantaneously rises). Also in this comparison example, at time t2 in FIG. 3 and the like, the drain current Id flowing through the semiconductor switch 14 excessively increases, and the voltage Vgs between the gate and the source of the semiconductor switch 14 rapidly increases and becomes a value higher than the threshold voltage VTH. As a result, the transistor Q1 is turned on, and thus the transistor Q2 is also turned on.

In this case, when both the transistors Q1 and Q2 are turned on, the gate of the semiconductor switch 14 is grounded through the transistors Q1 and Q2. Therefore, the voltage Vgs between the gate and the source decreases rapidly to 0 V. As a result, since the semiconductor switch 14 is turned off, the overcurrent flowing through the semiconductor switch 14 can be stopped, and the overcurrent protection circuit 111 can start the protection operation. The time from the occurrence of the short circuit at time t2 until the overcurrent protection circuit 111 starts the protection operation includes a delay in the switching of the transistors Q1 and Q2, and is short, for example, about 20 to 100 nanoseconds.

In addition, when the transistor Q2 is turned on, the detection voltage Vocp rapidly decreases to 0 V. In this case, when the resistor R1 is smaller than the pull-up resistor R2, the voltage Vgs between the gate and the source decreases faster than the detection voltage Vocp. Therefore, even if the voltage Vgs between the gate and the source decreases, the transistor Q1 can be kept on. Thereafter, when the drive signal Sdrv of the controller unit becomes the low level, the driver unit 13 is stopped, and the voltage Vgs between the gate and the source decreases to 0 V. Therefore, since the transistors Q1 and Q2 are sequentially turned off, the detection voltage Vocp rises to the threshold voltage VTH again, and the protection operation ends.

The voltage detector circuit 15 outputs a signal indicating the detection voltage Vocp to the controller unit 12. The controller unit 12 monitors the value of the detection voltage Vocp, and when the detection voltage Vocp becomes less than a predetermined threshold, determines that the protection operation is performed, sets the abnormality detection flag Fh to the high level, and stops the output of the drive signal Sdrv (time t3). In a Vgs signal turned off interval (stop interval) 203 after time t3, the drive signal Sdrv is always at the low level, and the semiconductor switch 14 is always kept turned off.

In this case, in a case where the response of the controller unit 12 is slow, the drive signal Sdrv can become the high level again before the output of the drive signal Sdrv is stopped at time t3. In that case, as shown in FIG. 3A, an overcurrent flows through the semiconductor switch 14 again, and the overcurrent protection circuit 111 starts the protection operation again.

As described above, the overcurrent protection circuit 111 according to the comparison example includes the pull-up resistor R2, the PNP transistor Q1, the NPN transistor Q2, and the voltage detector circuit 15. When the voltage Vgs between the gate and the source of the semiconductor switch 14 exceeds the threshold voltage VTH, the transistors Q1 and Q2 are sequentially turned on. As a result, the overcurrent protection circuit 111 decreases the voltage Vgs between the gate and the source to zero and starts the protection operation of turning off the semiconductor switch. In addition, the controller unit 12 monitors the detection voltage Vocp detected by the voltage detector circuit 15, and stops the driver unit 13 and turns off the semiconductor switch 14 when the detection voltage Vocp becomes less than a predetermined threshold voltage. Therefore, according to the present embodiment, the overcurrent flowing through the semiconductor switch 14 can be stopped at a higher speed than in the prior art, and the semiconductor switch 14 can be protected.

Problems of Comparison Example

As described above, in the overcurrent protection circuit 111 according to the comparison example, the overcurrent protection function is realized by monitoring the gate voltage Vgs of the current-driven semiconductor switch 14 using the transistors Q1 and Q2 and the detection voltage Vocp.

However, in this configuration, there is a problem that there is a possibility that an overvoltage 120 is applied as a voltage Vbe between the base and the emitter of the transistor Q1 when the undershoot 120 of the voltage between the gate and the source when the semiconductor switch 14 illustrated in FIG. 3B is turned off or when the negative gate bias voltage is applied to the semiconductor switch 14.

First Embodiment

Figure 4:
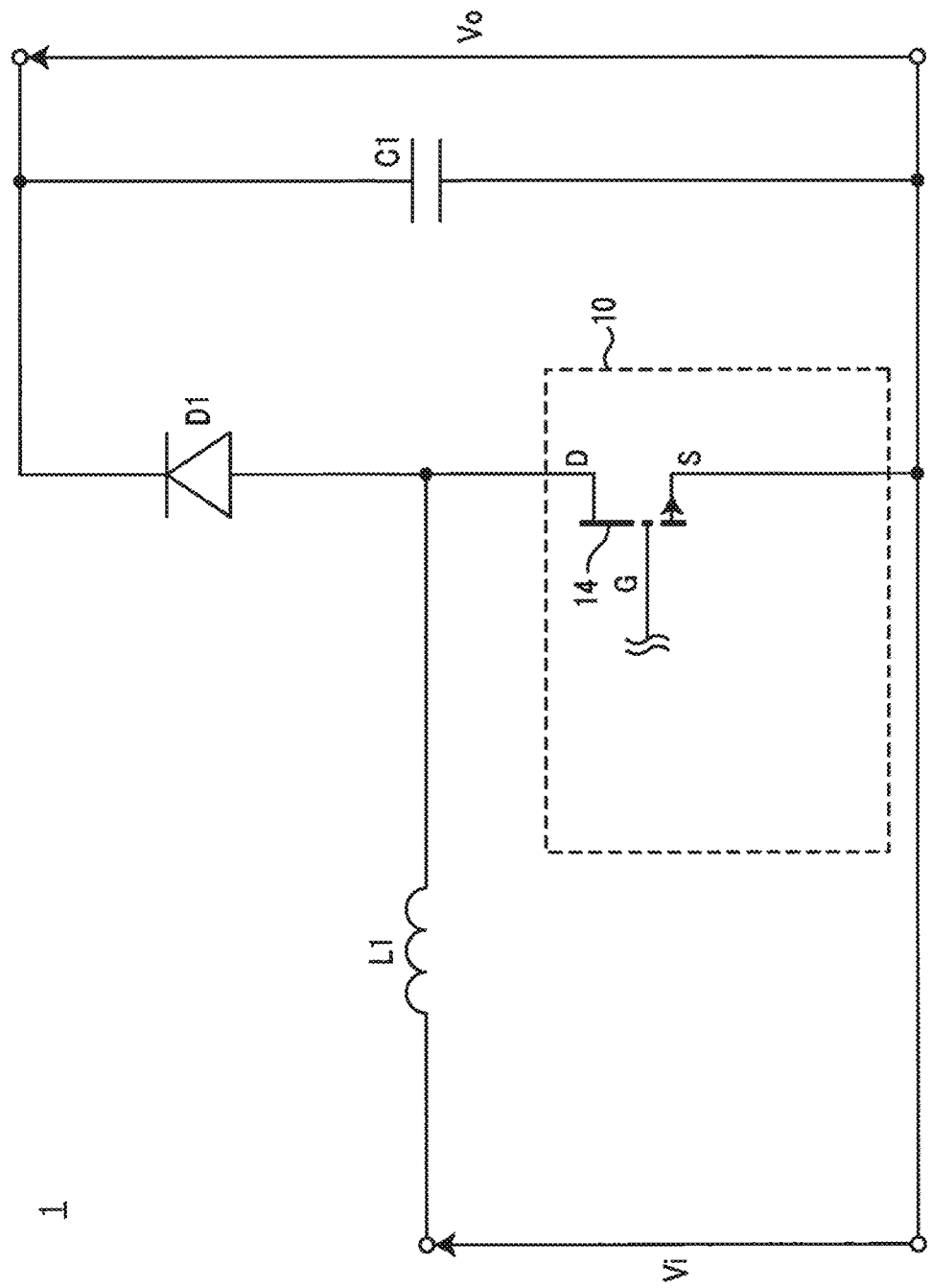
FIG. 4 is a block diagram illustrating a configuration example of a boost chopper circuit 1 according to a first embodiment.
Figure 5:
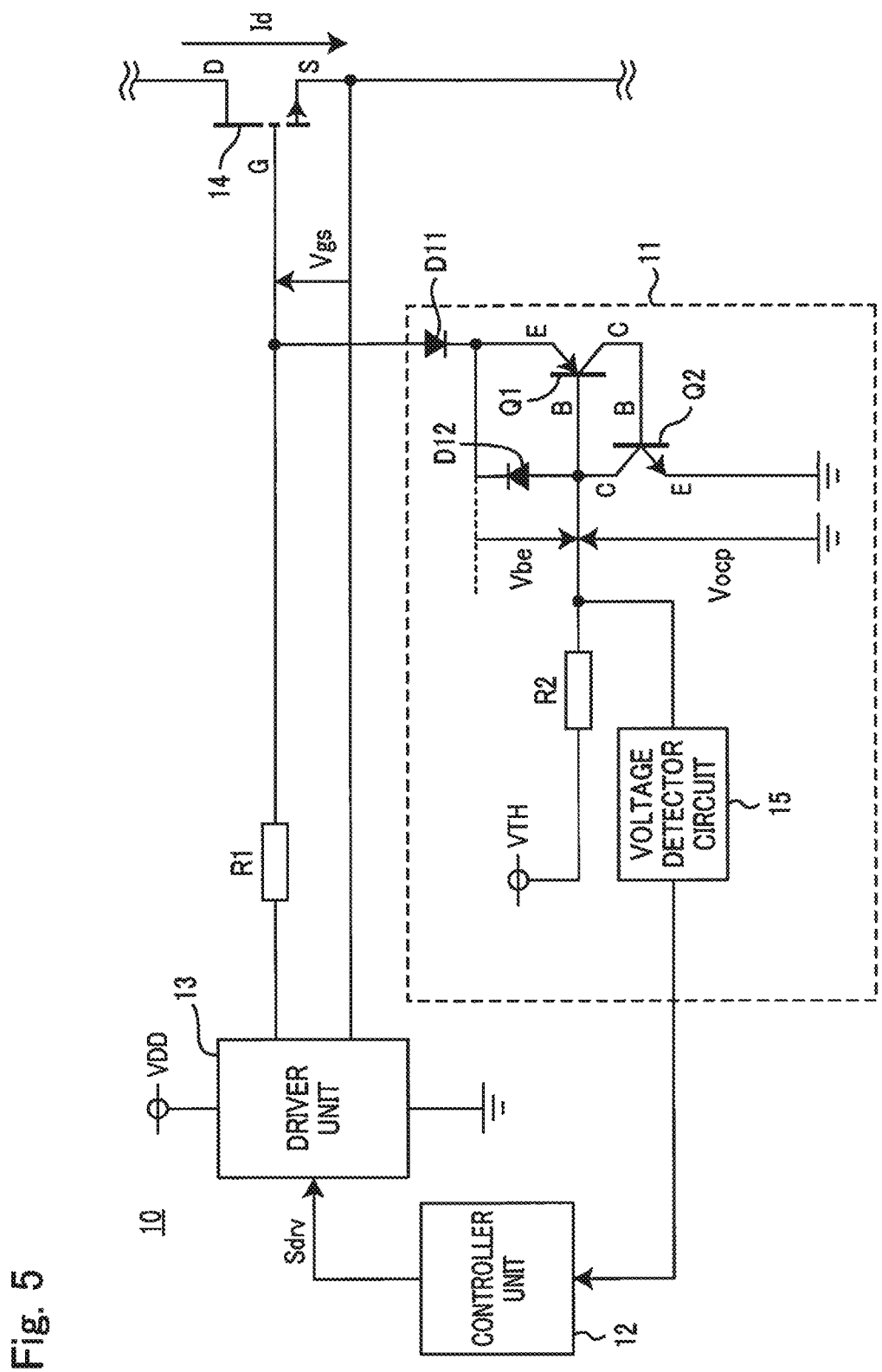
FIG. 5 is a block diagram illustrating a detailed configuration example of a current-driven switching circuit 10 of FIG. 4.

FIG. 4 is a block diagram illustrating a configuration example of a boost chopper circuit 1 according to a first embodiment, and FIG. 5 is a block diagram illustrating a detailed configuration example of a current-driven switching circuit 10 of FIG. 4. In FIG. 4, the boost chopper circuit 1 has a circuit configuration similar to that of the boost chopper circuit 101 of FIG. 1, but the current-driven switching circuit 10 of FIG. 5 has the following differences from the switch drive circuit 110 of FIG. 2 in order to solve the problem in the comparison example.

(1) An overcurrent protection circuit 11 is provided instead of the overcurrent protection circuit 111. Specifically, it is as follows.

(2) A diode D11 is inserted between the gate of the semiconductor switch 14 and the emitter of the transistor Q1. In this case, the anode of the diode D11 is connected to the gate of the semiconductor switch 14, and the cathode of the diode D11 is connected to the emitter of the transistor Q1.

(3) A diode D12 is inserted between the emitter and the base of the transistor Q1. In this case, an anode of the diode D12 is connected to the base of the transistor Q1, and the cathode of the diode D12 is connected to the emitter of the transistor Q1. In this case, the diode D12 is an example of an element circuit in the present invention.

FIG. 6 is a timing chart showing operation waveforms of signals and the like in the current-driven switching circuit 10 of FIG. 5, and FIGS. 7A to 7D are enlarged diagrams of the voltage Vbe between the base and the emitter and the detection voltage Vocp of FIG. 6 for explaining that any overvoltage is prevented by adding the diodes D11 and D12 in the current-driven switching circuit 10 of FIG. 5.

Figure 7A:
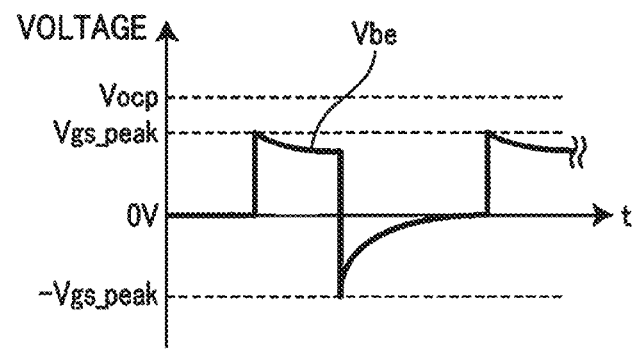
FIG. 7A is an enlarged diagram of a voltage Vbe between a base and an emitter of FIG. 6 for explaining that any overvolt0age is prevented by adding diodes D11 and D12 in the current-driven switching circuit 10 of FIG. 5.

In the first embodiment, by additionally inserting the diode D12 as illustrated in FIG. 5, as illustrated in FIG. 7A, the charge of the voltage Vbe between the base and the emitter of the transistor Q1 is discharged to the emitter side of the transistor Q1 via the diode D12. In addition, the diode D11 is made to bear a voltage of the detection voltage Vocp+Vds (Vds denotes a voltage between the drain and source of the semiconductor switch 14). As a result, it is a feature that any overvoltage in the voltage Vbe between the base and the emitter of the transistor Q1 is prevented.

Figure 7B:
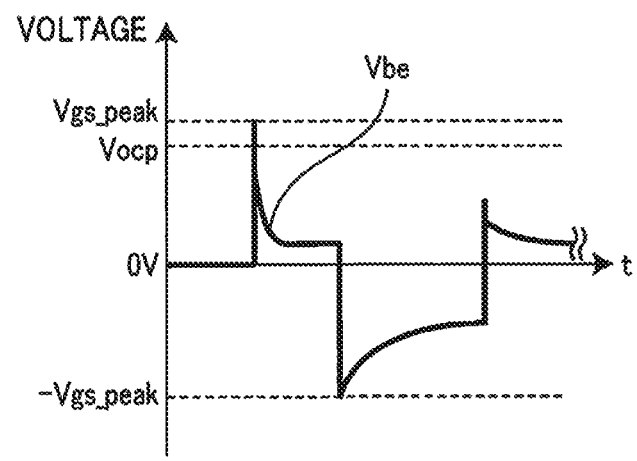
FIG. 7B is an enlarged diagram of the voltage Vbe between the base and the emitter of the transistor Q1 of FIG. 6 when a protection prevention function is activated in the current-driven switching circuit 10 of FIG. 5.

When an overcurrent occurs in the semiconductor switch 14, as illustrated in FIG. 7B, the overshoot (Vocp-Vgs) of the voltage Vgs between the gate and the source is applied between the base and the emitter of the transistor Q1, and the protection function is activated when the transistor Q1 is conducted.

Figure 7C:
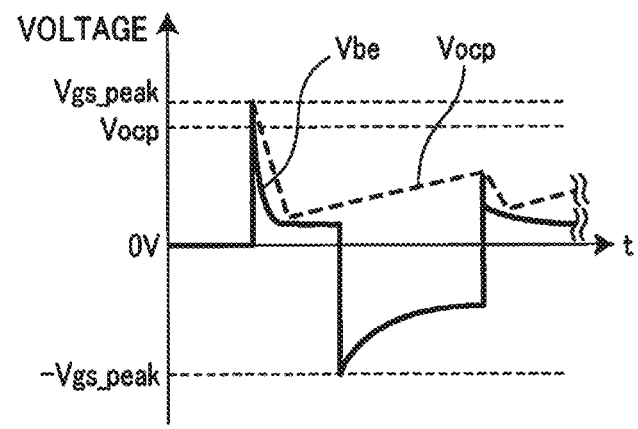
FIG. 7C is an enlarged diagram of the voltage Vbe between the base and the emitter and a detection voltage Vocp of the transistor Q1 of FIG. 6 when shifting to a protection operation hold state in the current-driven switching circuit 10 of FIG. 5.

In addition, after the protection operation, as illustrated in FIG. 7C, the detection voltage Vocp serving as the threshold voltage is discharged and decreased by transistors Q1 and Q2, and the state transitions to a protection operation hold state.

Figure 7D:
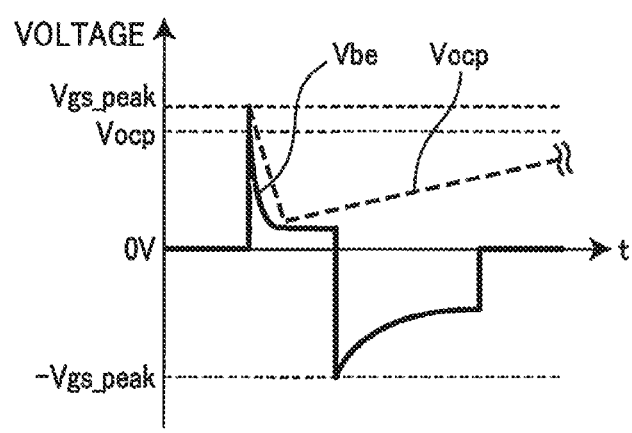
FIG. 7D is an enlarged diagram of the voltage Vbe between the base and the emitter and the detection voltage Vocp of the transistor Q1 of FIG. 6 for explaining adjustment of the time from the protection operation hold state to automatic recovery in the current-driven switching circuit 10 of FIG. 5.

Further, the protection operation hold state is automatically restored by stopping the gate signal to the semiconductor switch 14. As illustrated in FIG. 7D, the time to recovery can be set by adjusting the rise time of the detection voltage Vocp by the resistor R2 (or impedance).

As described above, according to the first embodiment, by additionally inserting the diodes D11 and D12 as compared with the comparison example, any overvoltage in the voltage Vbe between the base and the emitter of the transistor Q1 can be prevented.

Second Embodiment

Figure 8:
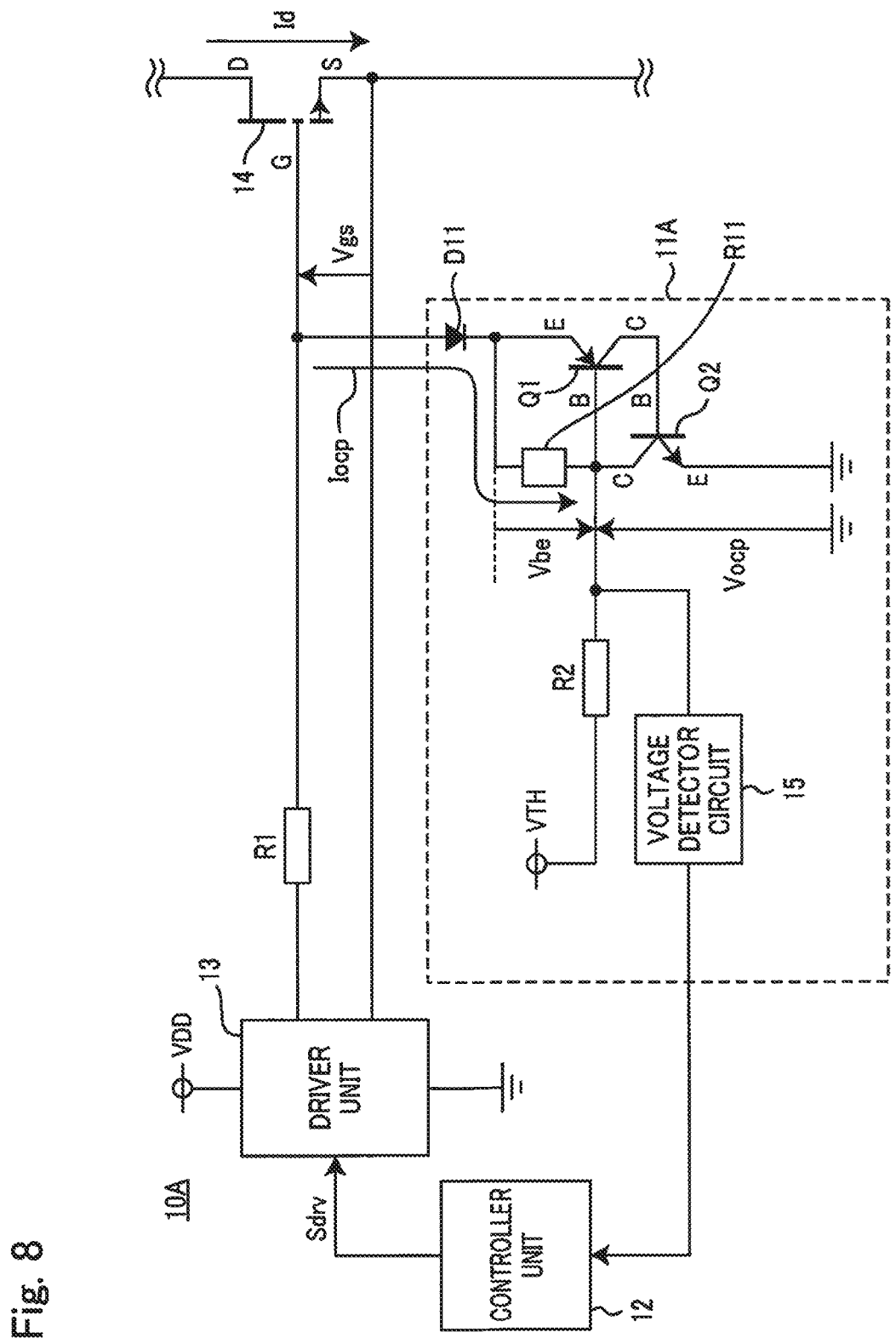
FIG. 8 is a block diagram illustrating a detailed configuration example of a current-driven switching circuit 10A according to a second embodiment.

FIG. 8 is a block diagram illustrating a detailed configuration example of a current-driven switching circuit 10A according to a second embodiment. The current-driven switching circuit 10A of FIG. 8 has the following differences from the current-driven switching circuit 10 of FIG. 5.

(1) An overcurrent protection circuit 11A is provided instead of the overcurrent protection circuit 11. Specifically, it is as follows.

(2) A resistor R11 is inserted instead of the diode D12. In this case, the resistor R11 is an example of an element circuit in the present invention.

Hereinafter, the differences will be described.

Figure 9A:
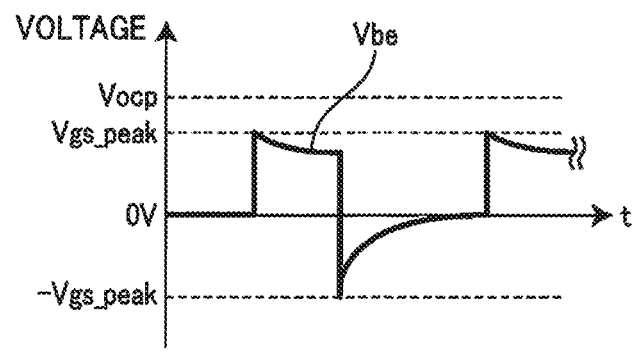
FIG. 9A is a waveform diagram of the voltage Vbe between the base and the emitter of a transistor Q1 for explaining that any overvoltage is prevented by adding a diode D11 and a resistor R11 in the current-driven switching circuit 10A of FIG. 8.

Referring to FIG. 8, by additionally inserting the resistor R11 instead of the diode D12 of FIG. 5, electric charge between the base and the emitter of the transistor Q1 is discharged to the emitter side of the transistor Q1 via the resistor R11. In addition, in a manner similar to that of the first embodiment, any overvoltage between the base and the emitter of the transistor Q1 can be prevented by causing the diode D11 to bear the detection voltage (Vocp+Vds) (see FIG. 9A).

Figure 9B:
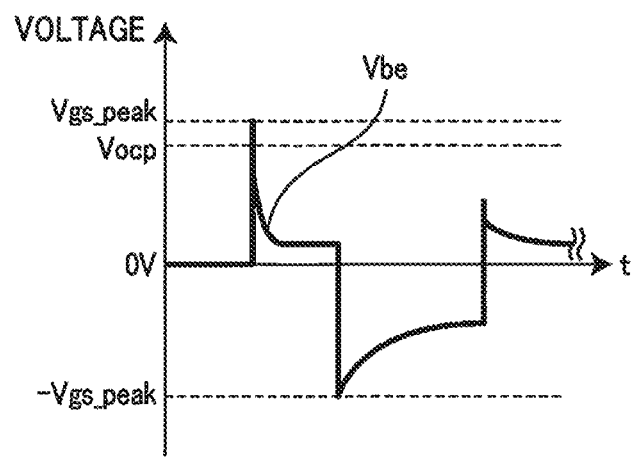
FIG. 9B is a waveform diagram of the voltage Vbe between the base and the emitter of the transistor Q1 when a protection function operates in the current-driven switching circuit 10A of FIG. 8.
Figure 9C:
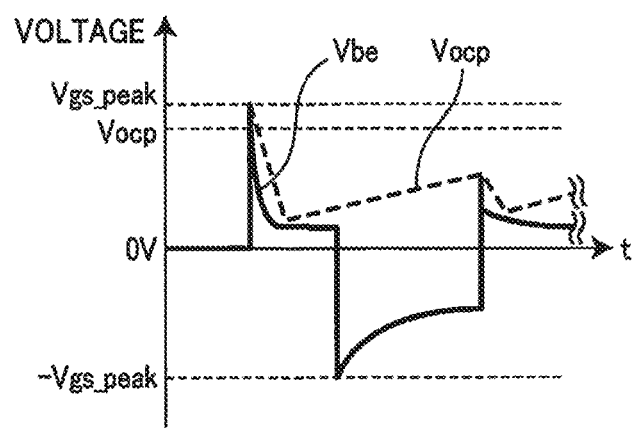
FIG. 9C is a waveform diagram of the voltage Vbe between the base and the emitter and a detection voltage Vocp of the transistor Q1 for explaining adjustment of the time from a protective function hold state to automatic recovery in the current-driven switching circuit 10A of FIG. 8.

For example, when an overcurrent occurs in a semiconductor switch 14, a current Iocp due to the overshoot of the voltage Vgs between the gate and the source flows from the gate of the semiconductor switch 14 via the diode D11 and the resistor R11 as illustrated in FIG. 9B. When the voltage potential difference (=Iocp×R11) exceeds a threshold voltage between the base and the emitter of the transistor Q1, the transistor Q1 is conducted to activate the protection function. It is noted that the maintenance of the protection state and the automatic return to the steady state in the second embodiment operate in a manner similar to that of the first embodiment (see FIG. 9C).

As described above, according to the second embodiment, by additionally inserting the diode D11 and the resistor R11 as compared with the comparison example, any overvoltage in the voltage Vbe between the base and the emitter of the transistor Q1 can be prevented.

Third Embodiment

Figure 10:
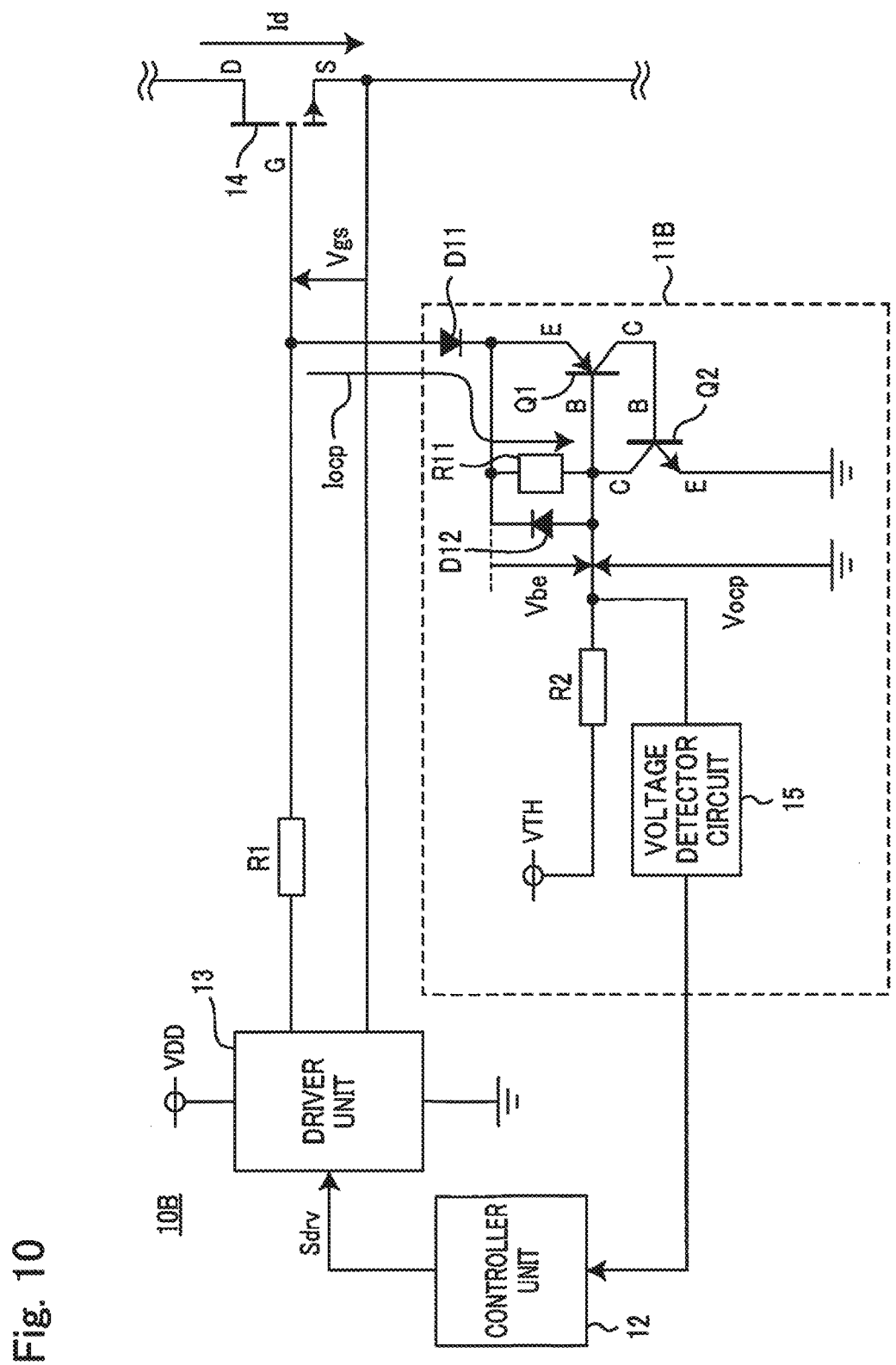
FIG. 10 is a block diagram illustrating a detailed configuration example of a current-driven switching circuit 10B according to a third embodiment.

FIG. 10 is a block diagram illustrating a detailed configuration example of a current-driven switching circuit 10B according to a third embodiment. The current-driven switching circuit 10B of FIG. 10 has the following differences from the current-driven switching circuit 10 of FIG. 5.

(1) An overcurrent protection circuit 11B is provided instead of the overcurrent protection circuit 11. Specifically, it is as follows.

(2) A resistor R11 is connected in parallel with the diode D12 of FIG. 8. In this case, the parallel circuit of the diode D12 and the resistor R11 is an example of an element circuit in the present invention.

Hereinafter, the differences will be described.

Figure 11A:
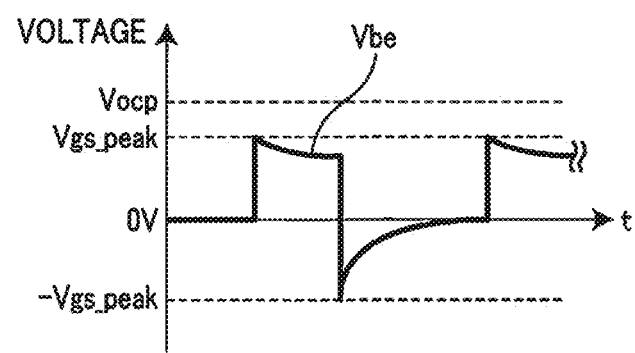
FIG. 11A is a waveform diagram of the voltage Vbe between the base and the emitter of a transistor Q1 for explaining that any overvoltage is prevented by adding diodes D11 and D12 and a resistor R11 in the current-driven switching circuit 10B of FIG. 10.

In the current-driven switching circuit 10B configured as described above, as illustrated in FIG. 11A, the basic operation is similar to that of the second embodiment.

Figure 11B:
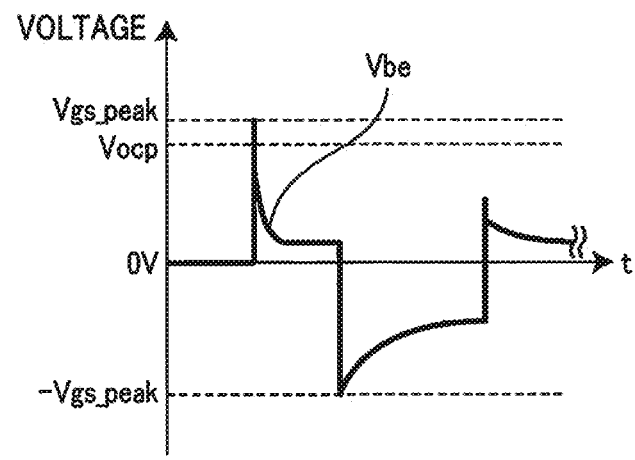
FIG. 11B is a waveform diagram of the voltage Vbe between the base and the emitter of the transistor Q1 for explaining adjustment of the time at the occurrence of overcurrent in the current-driven switching circuit 10B of FIG. 10.

In addition, as illustrated in FIG. 11B, for example, when an overcurrent occurs in a semiconductor switch 14, the voltage potential difference due to a detection voltage Vocp can be adjusted by the resistance value of the resistor 11. As a result, by changing each value of the combination of the detection voltage Vocp serving as a threshold voltage and the resistance value of the resistor R11, the operation of the semiconductor switch 14 can be optimized in accordance with the driving condition of the semiconductor switch 14.

As described above, according to the third embodiment, by additionally inserting a diode D11 and the parallel circuit of the diode D12 and the resistor R11 as compared with the comparison example, any overvoltage in the voltage Vbe between the base and the emitter of the transistor Q1 can be prevented.

Fourth Embodiment

In the comparison example of FIG. 1, when the voltage Vgs between the gate and the source of the semiconductor switch 14 rises, the detection voltage Vocp overshoots as shown in FIG. 3A. This delays the decrease of the detection voltage Vocp and delays the start of the protection operation. In addition, as described above, when the response speed of the controller unit 12 is slow after the overcurrent protection in a short-circuit interval Ps, the overcurrent repeatedly flows through the semiconductor switch 14, which is undesirable. In order to solve this problem, a configuration according to the following fourth embodiment is proposed.

Figure 12A:
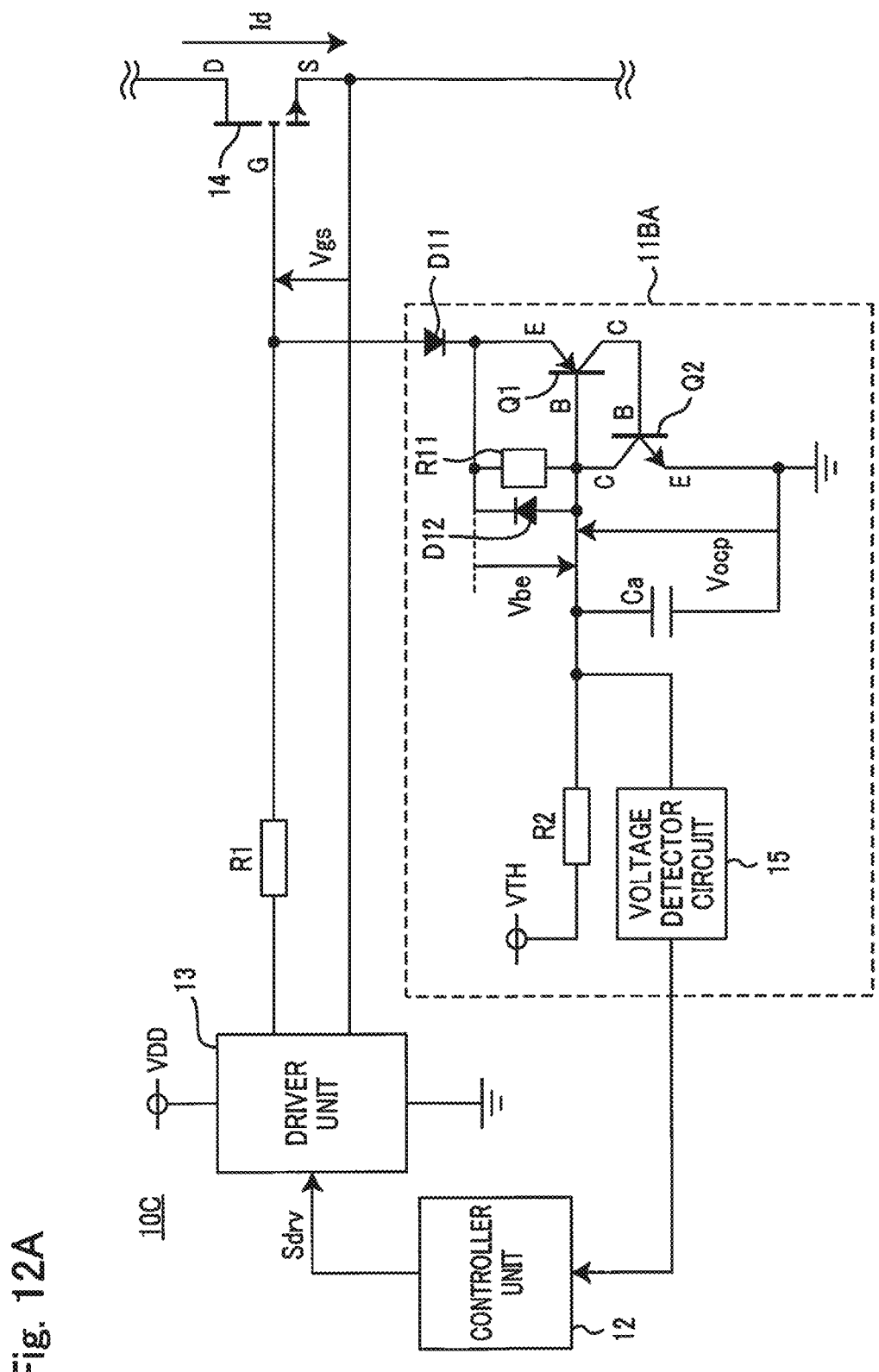
FIG. 12A is a block diagram illustrating a detailed configuration example of a current-driven switching circuit 10C according to a fourth embodiment.

FIG. 12A is a block diagram illustrating a detailed configuration example of a current-driven switching circuit 10C according to a fourth embodiment. In addition, FIG. 12B is a timing chart showing operation waveforms of signals and the like in the current-driven switching circuit 10C of FIG. 12A. In FIG. 12A, the current-driven switching circuit 10C according to the fourth embodiment is different from the current-driven switching circuit 10B in FIG. 10 in the following points.

(1) An overcurrent protection circuit 11BA is provided instead of the overcurrent protection circuit 11B. Specifically, it is as follows.

(2) Further, a capacitor Ca connected to the collector and the emitter of the transistor Q2 is further provided.

(3) A power source of a threshold voltage VTH charges the capacitor Ca to the threshold voltage VTH via a pull-up resistor R2.

In the fourth embodiment configured as described above, when a short circuit occurs in a semiconductor switch 14 and the voltage Vgs between the gate and the source rapidly rises, the detected voltage Vocp overshoots due to the rise of the voltage Vgs between the gate and the source, but this change is reduced by the capacitor Ca (see a protection operation interval 202 in FIG. 12B). Therefore, a delay in the start of the protection operation can be suppressed.

In addition, when transistors Q1 and Q2 are turned on in the protection operation interval 202 (FIG. 12B) after the occurrence of the short circuit, the capacitor Ca is grounded via the transistor Q2, and the capacitor Ca is discharged to the zero voltage potential. Thereafter, a drive signal Sdrv becomes the low level, the transistors Q1 and Q2 are turned off, and the detection voltage Vocp starts to rise. In this case, the threshold voltage VTH charges the capacitor Ca. Therefore, the time taken for the detection voltage Vocp to rise to the threshold voltage VTH is longer than the time in the comparison example and the third embodiment. By appropriately selecting the capacitor Ca, the time taken for the detection voltage Vocp to rise to the threshold voltage VTH can be made longer than the time taken for the drive signal Sdrv to reach the high level again. As a result, even if the control signal becomes the high level again, the transistors Q1 and Q2 are turned on before the voltage Vgs between the gate and the source reaches the threshold voltage VTH, and the semiconductor switch 14 is protected.

As described above, the overcurrent protection circuit 11BA according to the fourth embodiment further includes the capacitor Ca in addition to the overcurrent protection circuit 11B. As a result, the time from when the overcurrent protection circuit 11BA performs the protection operation to return from the protection operation can be made longer than that of the overcurrent protection circuit 111 according to the comparison example, and a phenomenon in which an overcurrent repeatedly flows through the semiconductor switch 14 can be prevented. In addition, the overshoot of the detection voltage Vocp due to the rise of the voltage Vgs between the gate and the source can be made smaller than that of the overcurrent protection circuit 111, and the delay at the start of the protection operation can be made smaller than that of the overcurrent protection circuit 111.

Although the overcurrent protection circuit 11BA according to the fourth embodiment includes the parallel circuit of the diode D12 and a resistor R11, the present invention is not limited thereto, and only the diode D12 or only the resistor R11 may be provided instead of the parallel circuit.

Fifth Embodiment

Figure 13:
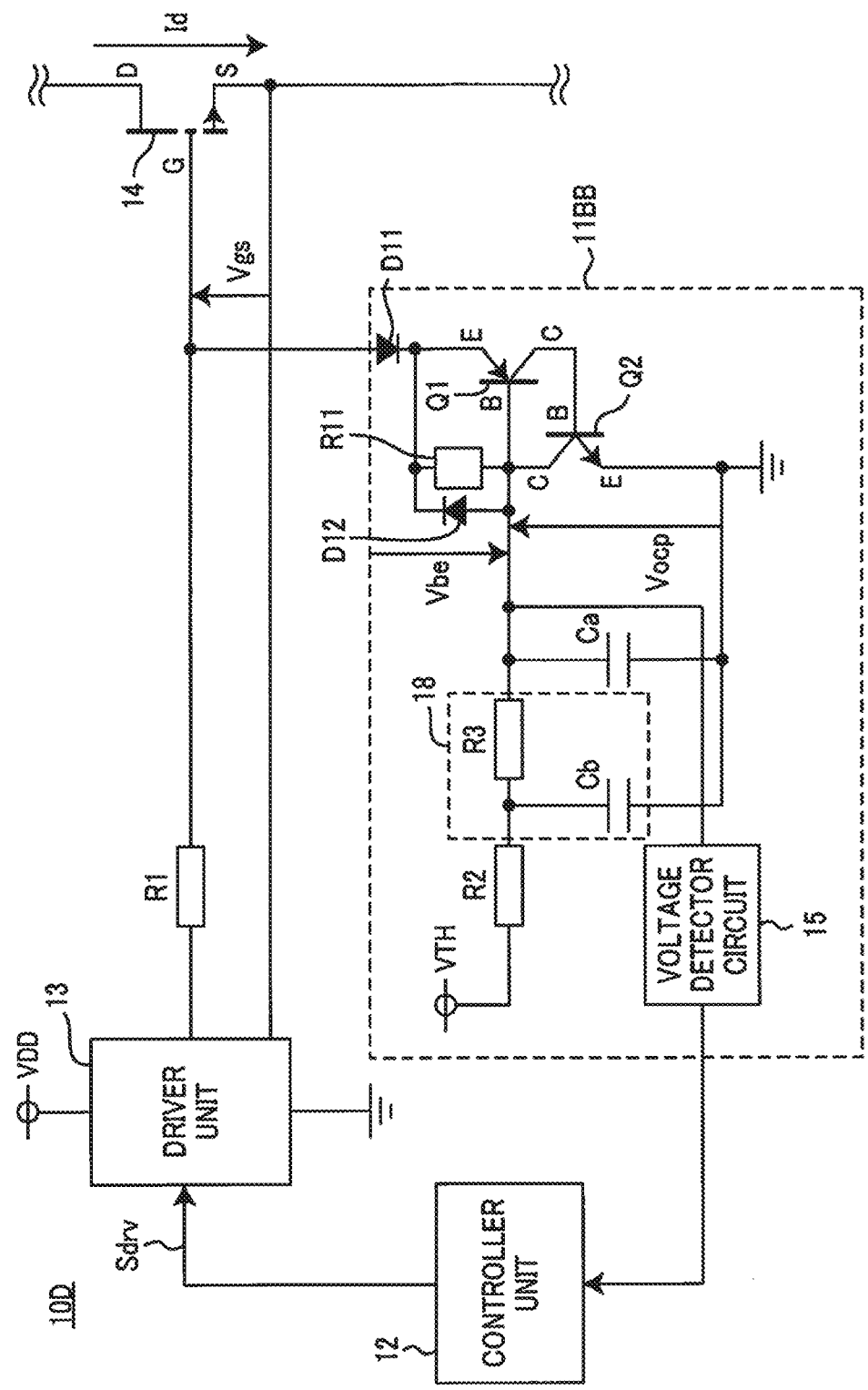
FIG. 13 is a block diagram illustrating a detailed configuration example of a current-driven switching circuit 10D according to a fifth embodiment.

FIG. 13 is a block diagram illustrating a configuration example of a current-driven switching circuit 10D according to a fifth embodiment. In FIG. 13, the current-driven switching circuit 10D according to the fifth embodiment is different from the current-driven switching circuit 10BA in FIG. 12A in the following points.

(1) An overcurrent protection circuit 11BB is provided instead of the overcurrent protection circuit 11BA. Specifically, it is as follows.

(2) Further, a time constant circuit 18 including a resistor R3 and a capacitor Cb is provided.

(3) The time constant circuit 18 is connected in parallel to the collector and the emitter of the transistor Q2.

In the overcurrent protection circuit 11BB configured as described above, the time constant at which the capacitor Ca discharged to the zero voltage potential is charged to a threshold voltage VTH is adjusted, and the time until the overcurrent protection circuit 11BB returns from a protection operation is longer than that in the overcurrent protection circuit 11BA. It is noted that the same effect can be obtained by inserting the time constant circuit 18 into the current-driven switching circuits 10, 10A, and 10B of the first to third embodiments.

As described above, the current-driven switching circuit 10BB according to the fifth embodiment further includes the time constant circuit 18 including the resistor R3 and the capacitor Cb. The time until the overcurrent protection circuit 11BB returns from the protection operation is adjusted by appropriately selecting the resistor R3 and the capacitor Cb.

Although the overcurrent protection circuit 11BB according to the fifth embodiment includes a parallel circuit of a diode D12 and a resistor R11, the present invention is not limited thereto, and only the diode D12 or only the resistor R11 may be provided instead of the parallel circuit.

Sixth Embodiment

Figure 14:
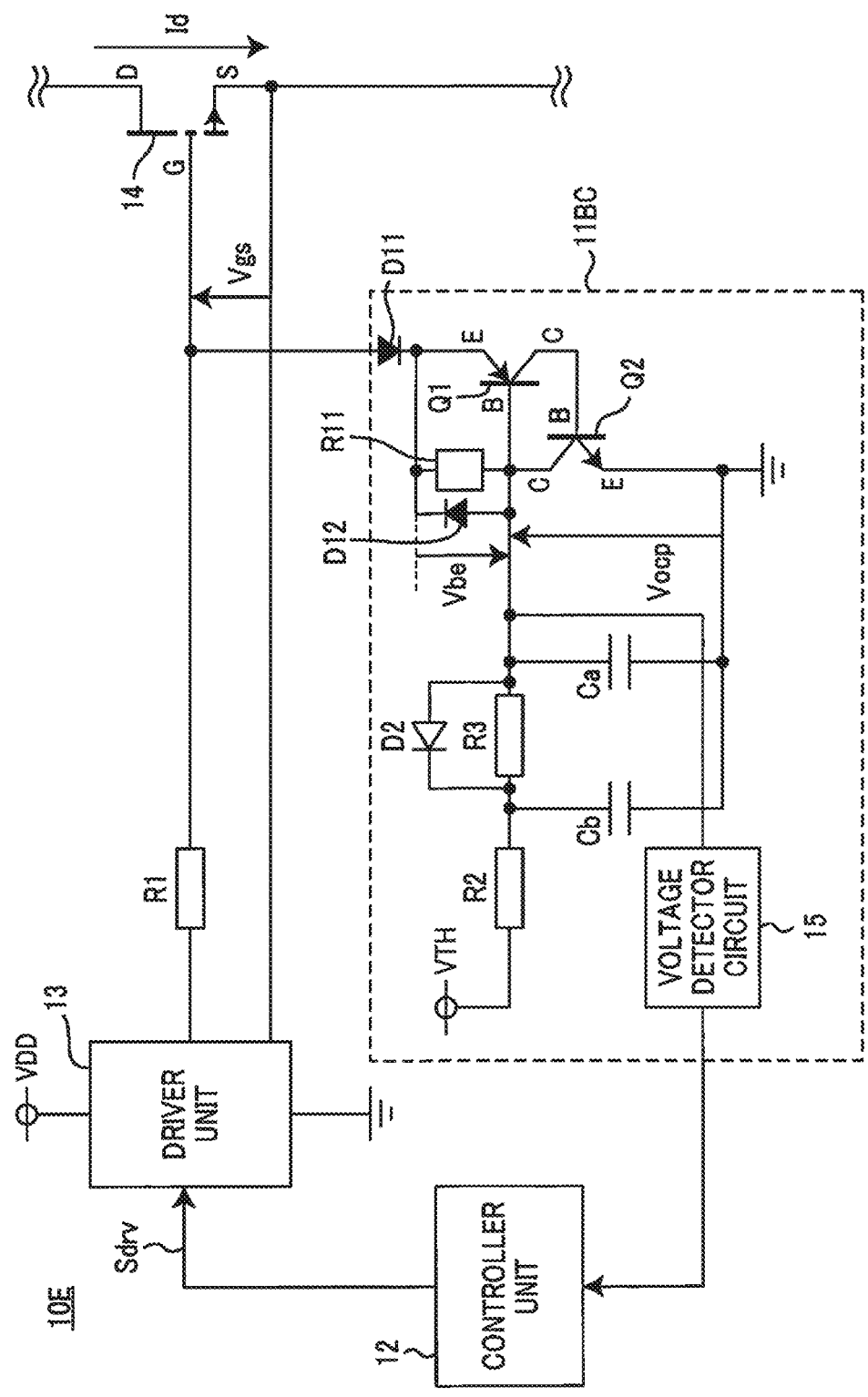
FIG. 14 is a block diagram illustrating a detailed configuration example of a current-driven switching circuit 10E according to a sixth embodiment.

FIG. 14 is a block diagram illustrating a configuration example of a current-driven switching circuit 10E according to a sixth embodiment. In FIG. 14, the current-driven switching circuit 10E is different from the current-driven switching circuit 10D in FIG. 13 in the following points.

(1) An overcurrent protection circuit 11BC is provided instead of the overcurrent protection circuit 11BB. Specifically, it is as follows.

(2) The overcurrent protection circuit 11BC further includes a diode D2 having an anode connected to one end on a low voltage potential side of a resistor R3 and a cathode connected to the other end of the resistor R3.

The current-driven switching circuit 10E according to the sixth embodiment configured as described above further includes the diode D2. Therefore, the influence of noise in the voltage Vgs between the gate and the source and the like on the overcurrent protection circuit 11BC is suppressed more than the overcurrent protection circuit 11B.

Although the overcurrent protection circuit 11BC according to the sixth embodiment includes a parallel circuit of a diode D12 and a resistor R11, the present invention is not limited thereto, and only the diode D12 or only the resistor R11 may be provided instead of the parallel circuit.

Seventh Embodiment

Figure 15:
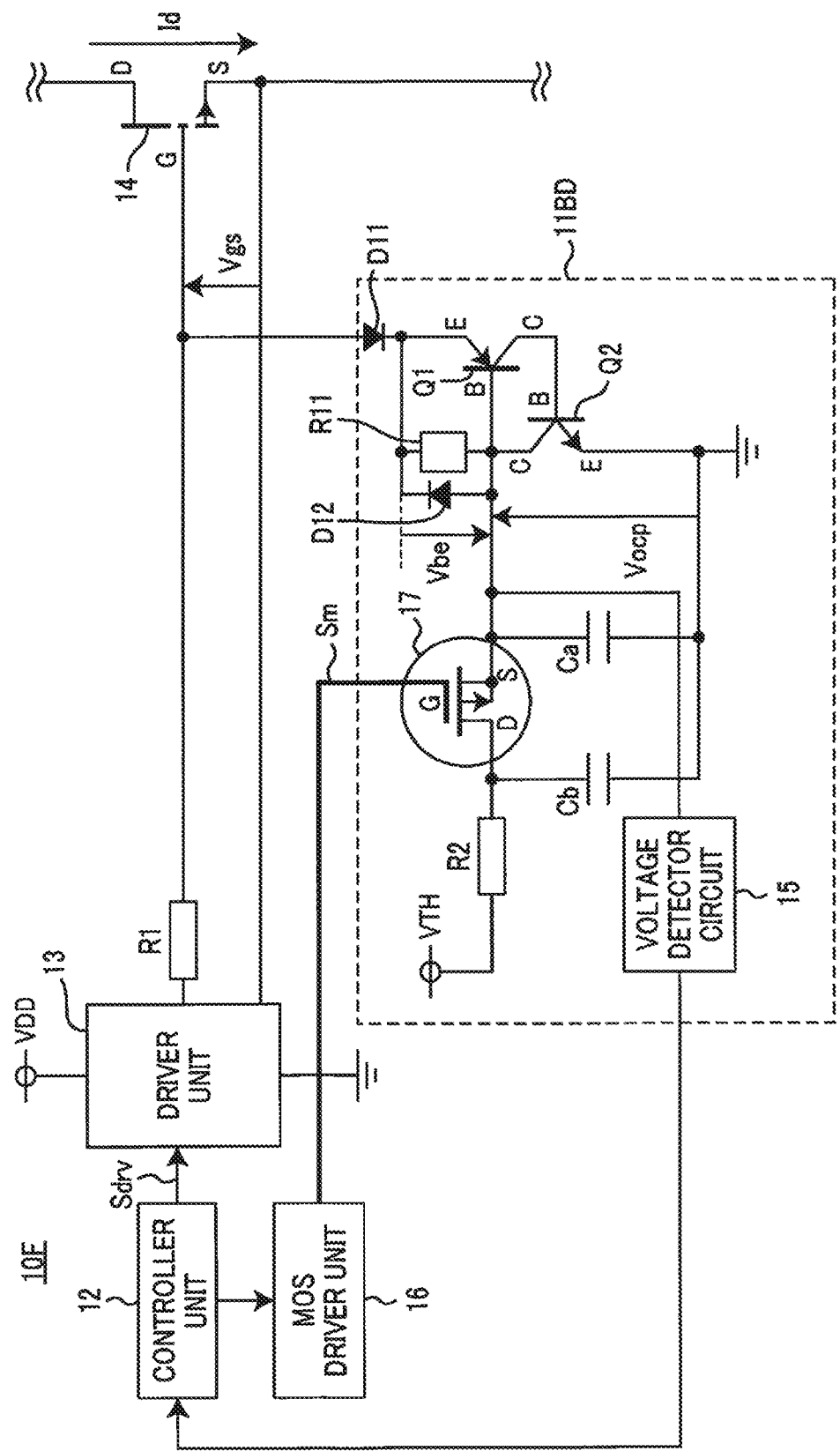
FIG. 15 is a block diagram illustrating a detailed configuration example of a current-driven switching circuit 10F according to a seventh embodiment.

FIG. 15 is a block diagram illustrating a configuration example of a current-driven switching circuit 10F according to a seventh embodiment. In FIG. 15, the current-driven switching circuit 10F is different from the current-driven switching circuit 10E in FIG. 14 in the following points.

(1) An overcurrent protection circuit 11BD is provided instead of the overcurrent protection circuit 11BC. Specifically, it is as follows.

(2) The current-driven switching circuit 10F further includes a MOS driver unit 16.

(3) The resistor R3 is replaced with a MOSFET 17.

Referring to FIG. 15, the MOS driver unit 16 is controlled by a controller unit 12, and outputs a MOS drive signal Sm to control turning on/off of the MOSFET 17. The MOSFET 17 is controlled by the MOS drive signal Sm, and interrupts (turned off) a threshold voltage VTH in the interval in which the MOS drive signal Sm has the low level.

That is, the current-driven switching circuit 10F has a preparation interval before the start of operation (time t1 in FIG. 6), the controller unit 12 turns on the MOSFET 17 via the MOS driver unit 16, and after a capacitor Ca is charged to the threshold voltage VTH, the controller unit 12 turns off the MOSFET 17 via the MOS driver unit 16. Thereafter, after the normal operation in a steady operation interval 201 from time t1 to time t2 in FIG. 6, protection is started in a protection operation interval 202 after occurrence of a short circuit, and the capacitor Ca is discharged to zero voltage potential. In the first to sixth embodiments, thereafter, in the protection operation interval 202 from time t2 to time t3, the drive signal Sdrv becomes the low level, the transistors Q1 and Q2 are turned off, and the capacitor Ca is charged again. However, in the present embodiment, since the MOSFET 17 is turned off, the capacitor Ca is not charged, and the overcurrent protection circuit 11BD holds the protection operation. Thereafter, when a detection voltage Vocp becomes lower than a predetermined threshold voltage, the controller unit 12 sets an abnormality detection flag Fh to the high level and stops the output of the drive signal Sdrv (time t3).

Subsequently, during a Vgs signal turned off interval 203 from time t3 to time t5, a user of a boost chopper circuit 1 can repair the short-circuit location to eliminate the short-circuit. Thereafter, for example, the higher-level control circuit detects elimination of the short circuit and controls the controller unit 12, or the user directly operates the controller unit 12, so that the abnormality detection flag Fh of the controller unit 12 becomes the low level. The controller unit 12 detects that the abnormality detection flag Fh becomes the low level, and turns on the MOSFET 17 to charge the capacitor Ca again. Next, in a manner similar to that of the previous preparation interval, in the second preparation interval, the MOS drive signal Sm has the high level, and the capacitor Ca is charged to the threshold voltage VTH.

By sufficient charging of the capacitor Ca in the second preparation interval, the overcurrent protection circuit 11BD returns from the protection operation. Thereafter, the current-driven switching circuit 10F returns to the original steady operation interval 201 and resumes the normal steady operation.

As described above, the current-driven switching circuit 10F according to the seventh embodiment includes the MOS driver unit 16 and the MOSFET 17. Therefore, the MOSFET 17 is controlled by the controller unit 12 via the MOS driver unit 16, and controls turning on/off of the threshold voltage VTH. Since the detection voltage Vocp does not increase during the interval in which the MOSFET 17 is turned off, the recovery from the protection operation can be performed at an arbitrary timing regardless of a delay in response of the controller unit 12 or the like. It is noted that, in a case where the MOSFET 17 includes a parasitic diode, an effect of suppressing noise can be obtained in a manner similar to that of the current-driven switching circuit 10E according to the sixth embodiment.

It is noted that the MOSFET 17 according to the present embodiment can be similarly inserted into any of the current-driven switching circuits 10 and 10A to 10E of the first to sixth embodiments, and the same effect can be obtained. In addition, the MOSFET 17 according to the present embodiment is an example of "a further switching element" of the present invention.

Eighth Embodiment

Figure 16:
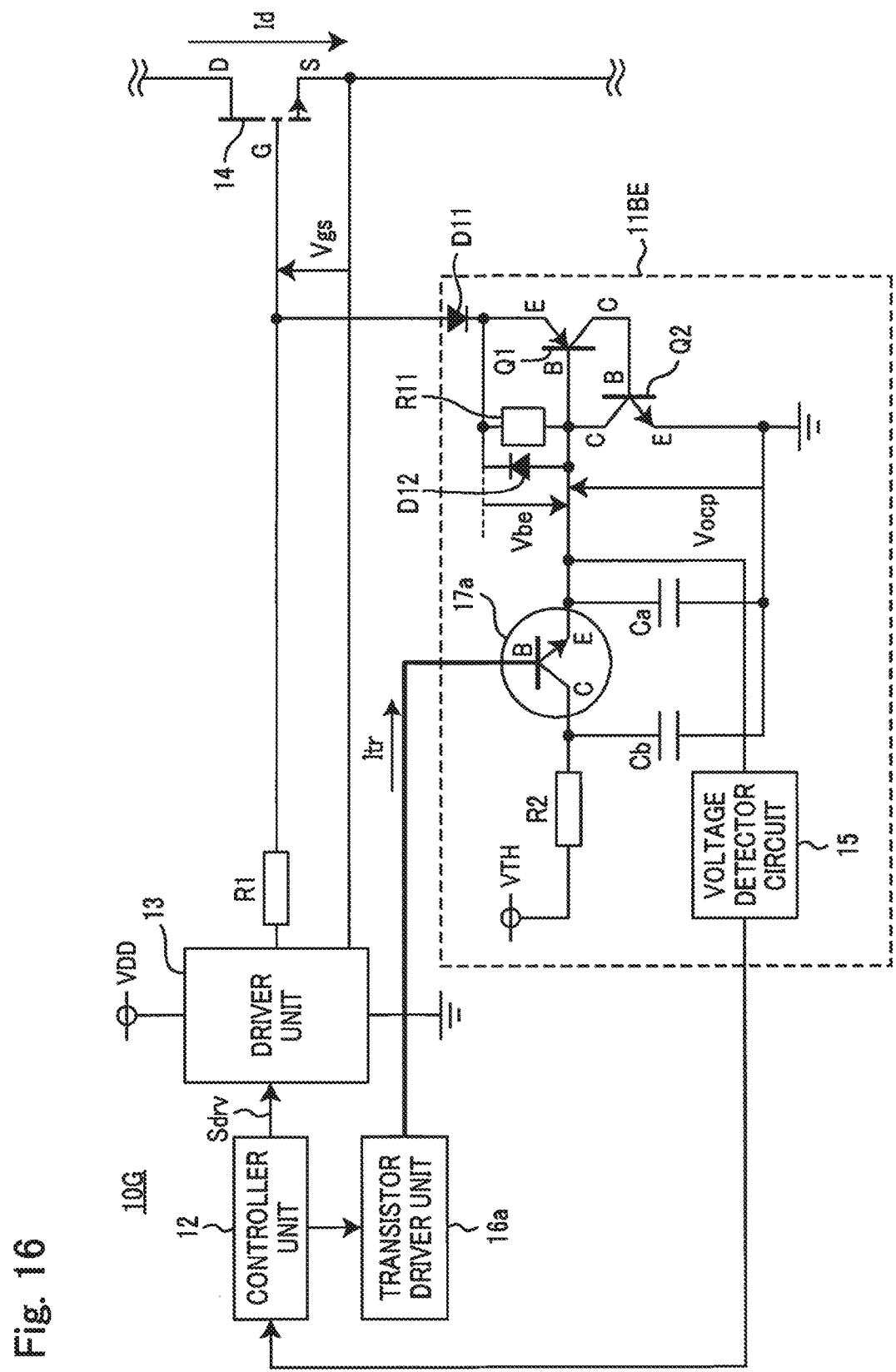
FIG. 16 is a block diagram illustrating a detailed configuration example of a current-driven switching circuit 10G according to an eighth embodiment.

FIG. 16 is a block diagram illustrating a configuration example of a current-driven switching circuit 10G according to an eighth embodiment. In FIG. 16, the current-driven switching circuit 10G is different from the current-driven switching circuit 10F in FIG. 15 in the following points.

(1) An overcurrent protection circuit 11BE is provided instead of the overcurrent protection circuit 11BD. Specifically, it is as follows.

(2) A transistor 17a is provided instead of the MOSFET 17.

(3) A transistor driver unit 16a is provided instead of the MOS driver unit 16.

A controller unit 12 controls a base current Itr of the transistor 17a via the transistor driver unit 16a to control turning on/off of the transistor 17a. As a result, the same effect as that of the seventh embodiment can be obtained.

It is noted that the transistor 17a according to the present embodiment can be similarly inserted into any of the current-driven switching circuits 10 and 10A to 10E of the first to sixth embodiments, and the same effect can be obtained. In addition, the transistor 17a according to the present embodiment is an example of "a further switching element" of the present invention.

MODIFIED EMBODIMENTS

Although the embodiments of the present invention have been described in detail above, the above description is merely an example of the present invention in all respects. It goes without saying that various improvements and modifications can be made without departing from the scope of the present invention. For example, the following modifications are possible. In the following description, the same reference numerals are used for the same components as those of the above embodiments, and the description of the same points as those of the above embodiments is appropriately omitted. The following modifications can be appropriately combined.

In the first to eighth embodiments, the boost chopper circuit 1 has been described as a semiconductor device including the current-driven switching circuit 10, 10A to 10G according to the present invention. However, the present invention is not limited thereto, and can be used for a circuit, an apparatus, and the like that control the switching of the current with the semiconductor switch.

Figure 17:
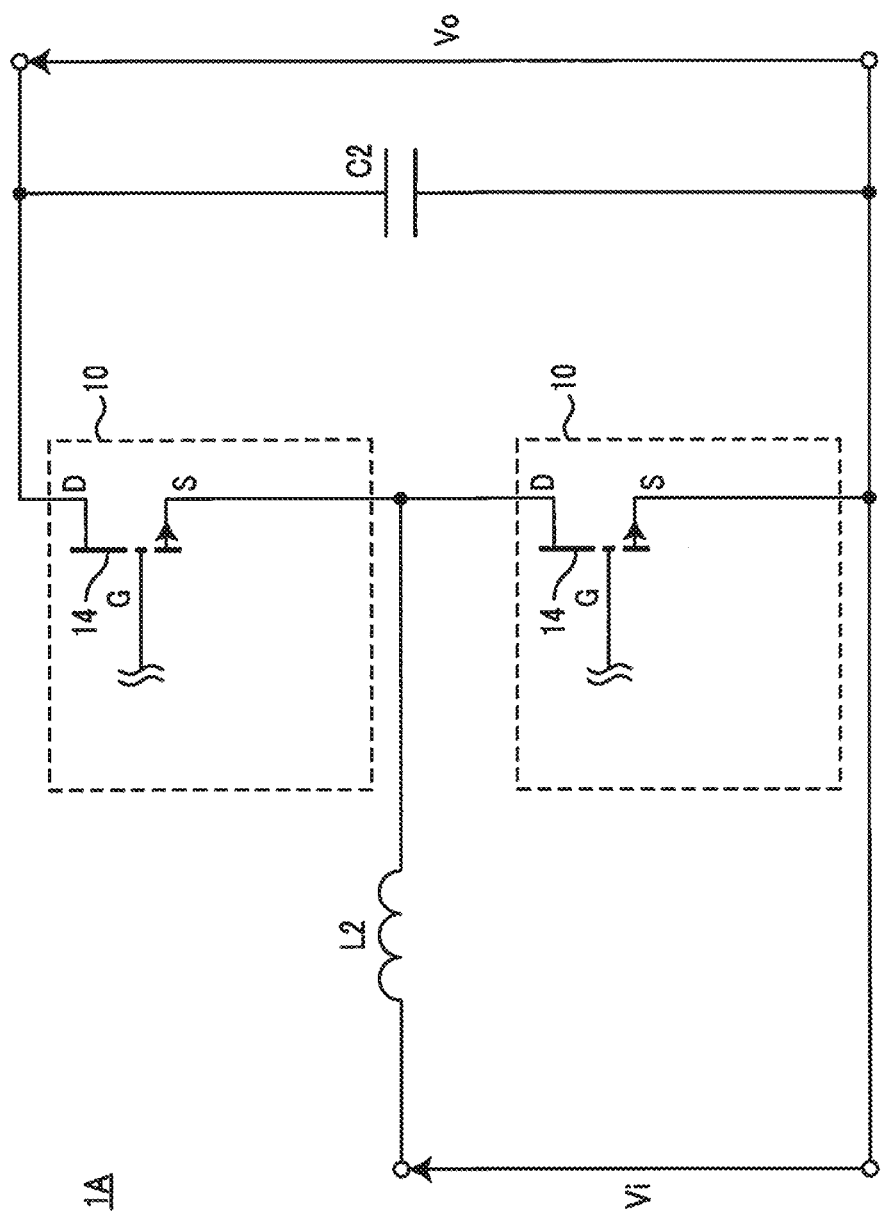
FIG. 17 is a block diagram illustrating a configuration example of a half-bridge inverter circuit 1A according to Modified Embodiment 1.

For example, FIG. 17 is a block diagram illustrating a configuration example of a half-bridge inverter circuit 1A according to Modified Embodiment 1. Referring to FIG. 17, the half-bridge inverter circuit 1A includes an inductor L2, two current-driven switching circuits 10, and a capacitor C2.

Referring to FIG. 17, semiconductor switches 14 of the two current-driven switching circuits 10 are controlled to be turned on periodically and alternately. As a result, an input voltage Vi is switched, smoothed by the capacitor C2, and converted into an AC output voltage Vo. As a result, the half-bridge inverter circuit 1A switches the DC input voltage Vi, converts the DC input voltage Vi into the AC output voltage Vo, and outputs the AC output voltage Vo. Each of the two current-driven switching circuits 10 may be replaced with any one of the current-driven switching circuits 10A to 10G.

Figure 18:
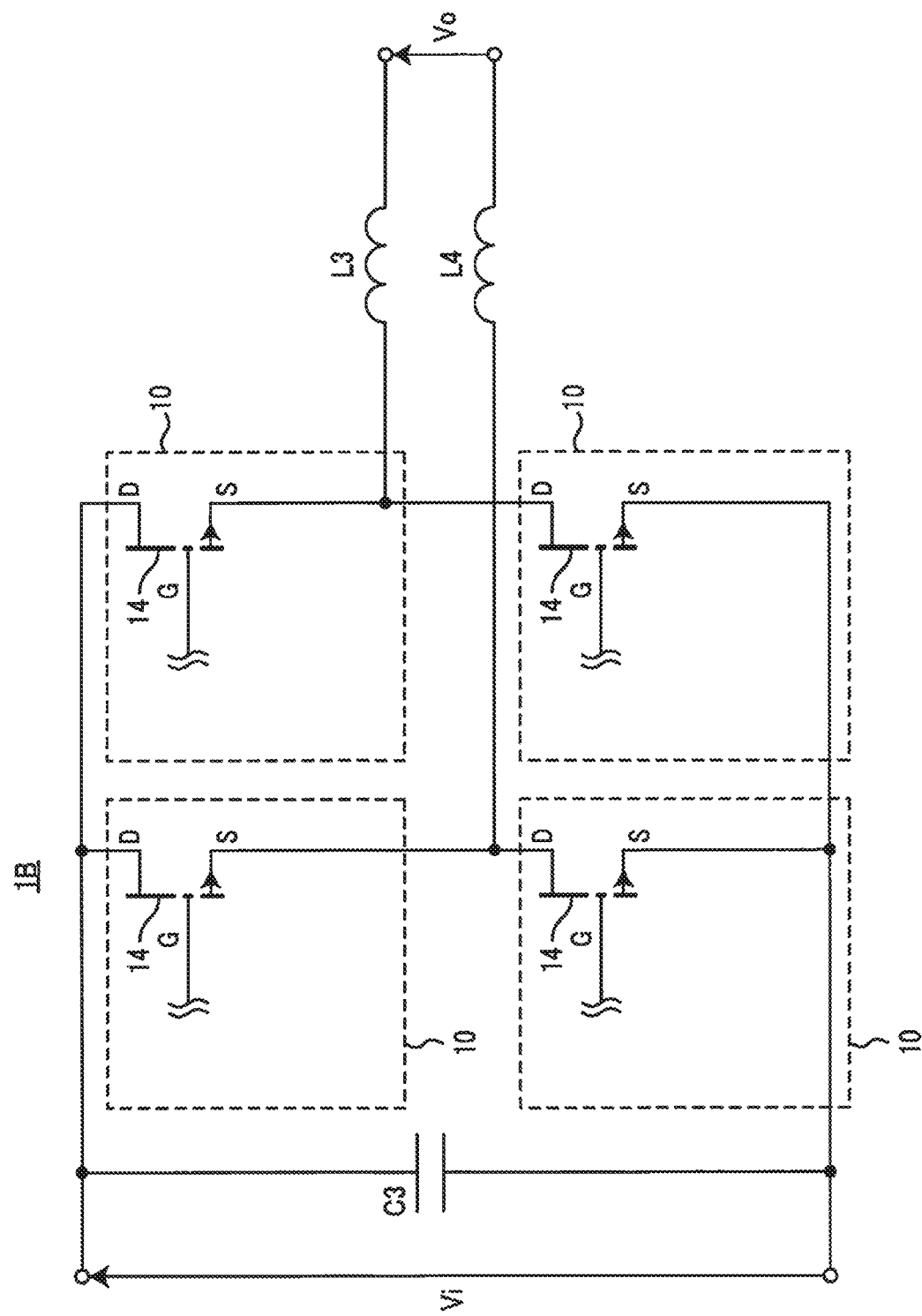
FIG. 18 is a block diagram illustrating a configuration example of a full-bridge inverter circuit 1B according to Modified Embodiment 2.

In addition, FIG. 18 is a block diagram illustrating a configuration example of a full-bridge inverter circuit 1B according to Modified Embodiment 2. In FIG. 18, the full-bridge inverter circuit 1B includes a capacitor C3, four current-driven switching circuits 10, and inductors L3 and L4.

Referring to FIG. 18, the four current-driven switching circuits 10 are controlled such that the interval in which the first and fourth current-driven switching circuits 10 (upper left and lower right figures in FIG. 18) are turned on and the second and third current-driven switching circuits 10 (lower left and upper right figures in FIG. 18) are turned off and the interval in which these turning on/off are reversed periodically alternately appear. As a result, an input voltage Vi is switched, and the switched input voltage Vi is smoothed by the capacitor C3 and the inductors L3 and L4. Thus, the full-bridge inverter circuit 1B switches the DC input voltage Vi, converts the DC input voltage Vi into an AC output voltage Vo, and outputs the AC output voltage Vo. Each of the four current-driven switching circuits 10 may be replaced with any one of the current-driven switching circuits 10A to 10G.

As described above, the current-driven switching circuit and the overcurrent protection circuit according to the present invention can be used for a circuit and an apparatus that controls switching of a current with a semiconductor device.

In addition, in the first to eighth embodiments, the pull-up resistor R2 is used as means for limiting the current from the power supply of the threshold voltage VTH. However, the present invention is not limited thereto, and a diode or the like may be used instead of the pull-up resistor R2.

Further, in the first to eighth embodiments, the current-driven switching circuit 10, 10A to 10G is used as the switching circuit. However, the present invention is not limited thereto, and a voltage-driven switching circuit may be used instead of the current-driven switching circuit.

The invention claimed is:

1. An overcurrent protection circuit for a switching element that is controlled to be turned on/off based on a control voltage, the overcurrent protection circuit comprising:
   a first transistor that is a PNP bipolar transistor and has an emitter connected to the control voltage; and
   a second transistor that is an NPN bipolar transistor, has a base connected to a collector of the first transistor, a collector connected to a base of the first transistor and pulled up to a predetermined pull-up voltage, and a grounded emitter,
   wherein the overcurrent protection circuit is configured to start a protection operation in which when the control voltage exceeds a predetermined first threshold voltage, the first and second transistors are turned on, the control voltage is decreased by decrease of the predetermined pull-up voltage, and the switching element is turned off,
   wherein the overcurrent protection circuit comprises:
   a first diode having an anode connected to the control voltage and a cathode connected to the emitter of the first transistor; and
   an element circuit connected between the emitter of the first transistor and the base of the first transistor, and
   wherein the element circuit is any one of:
   (1) a second diode having a cathode connected to the emitter of the first transistor and an anode connected to the base of the first transistor;
   (2) a first resistor; and
   (3) a parallel circuit of the second diode and the first resistor.

2. The overcurrent protection circuit as defined in claim 1, further comprising a first capacitor connected to the collector and the emitter of the second transistor, the first capacitor reducing a change in the pull-up voltage when the control voltage rises.

3. The overcurrent protection circuit as defined in claim 1, further comprising a time constant circuit connected in parallel to the collector and the emitter of the second transistor, the time constant circuit including a second resistor and a second capacitor, the time constant circuit adjusting a time from a start to an end of the protection operation by changing a time constant.

4. The overcurrent protection circuit as defined in claim 3, further comprising a third diode connected in parallel to the second resistor.

5. The overcurrent protection circuit as defined in claim 1, further comprising:
- a controller unit configured to generate the control voltage; and
- a voltage detection unit that detects the pull-up voltage and outputs the detected voltage to the controller unit as a first control signal for turning off the switching element.

6. The overcurrent protection circuit as defined in claim 5, further comprising a further switching element that turns on the pull-up voltage from turning off based on a second control signal from the controller unit when the overcurrent protection circuit returns from the protection operation.

7. A switching circuit comprising:
- an overcurrent protection circuit; and
- a switching element; and
- wherein the overcurrent protection circuit for the switching element that is controlled to be turned on/off based on a control voltage, the overcurrent protection circuit comprising:
- a first transistor that is a PNP bipolar transistor and has an emitter connected to the control voltage; and
- a second transistor that is an NPN bipolar transistor, has a base connected to a collector of the first transistor, a collector connected to a base of the first transistor and pulled up to a predetermined pull-up voltage, and a grounded emitter,
- wherein the overcurrent protection circuit is configured to start a protection operation in which when the control voltage exceeds a predetermined first threshold voltage, the first and second transistors are turned on, the control voltage is decreased by decrease of the predetermined pull-up voltage, and the switching element is turned off,
- wherein the overcurrent protection circuit comprises:
- a first diode having an anode connected to the control voltage and a cathode connected to the emitter of the first transistor; and
- an element circuit connected between the emitter of the first transistor and the base of the first transistor, and
- wherein the element circuit is any one of:
  (1) a second diode having a cathode connected to the emitter of the first transistor and an anode connected to the base of the first transistor;
  (2) a first resistor; and
  (3) a parallel circuit of the second diode and the first resistor.

\* \* \* \* \*